(12) United States Patent
Suzuki et al.

(10) Patent No.: US 8,263,969 B2
(45) Date of Patent: Sep. 11, 2012

(54) LAMINATED STRUCTURE AND IMAGE DISPLAY DEVICE

(75) Inventors: Koei Suzuki, Kanagawa (JP); Takanori Tano, Chiba (JP); Atsushi Onodera, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 625 days.

(21) Appl. No.: 12/428,645

(22) Filed: Apr. 23, 2009

(65) Prior Publication Data

US 2009/0278138 A1    Nov. 12, 2009

(30) Foreign Application Priority Data

May 7, 2008 (JP) .................................. 2008-121564

(51) Int. Cl.
*H01L 51/54* (2006.01)
(52) U.S. Cl. ............ 257/40; 427/457; 427/597; 257/88; 257/93
(58) Field of Classification Search .................... 257/40, 257/E51.001, 88, 93; 427/597, 457
See application file for complete search history.

(56) References Cited

U.S. PATENT DOCUMENTS

| | | | |
|---|---|---|---|
| 7,323,225 B2 * | 1/2008 | Aoki et al. | 427/447 |
| 2004/0238816 A1 * | 12/2004 | Tano et al. | 257/40 |
| 2007/0096088 A1 | 5/2007 | Tano et al. | |
| 2008/0029766 A1 | 2/2008 | Onodera et al. | |
| 2008/0061288 A1 * | 3/2008 | Tomono et al. | 257/40 |
| 2008/0124490 A1 * | 5/2008 | Kobayashi | 427/597 |

FOREIGN PATENT DOCUMENTS

| | | |
|---|---|---|
| JP | 3-281783 | 12/1991 |
| JP | 9-45766 | 2/1997 |
| JP | 2004-304124 | 10/2004 |
| JP | 2005-310962 | 11/2005 |
| JP | 2006-303545 | 11/2006 |

\* cited by examiner

*Primary Examiner* — Michael Shingleton
(74) *Attorney, Agent, or Firm* — Cooper & Dunham LLP

(57) ABSTRACT

A laminated structure includes a wettability variable layer formed on a substrate, including a material whose critical surface tension varies by receiving energy so that high and low surface energy regions are formed; a conductive layer formed in one of the high surface energy regions; and an insulating layer formed in such a manner as to cover the conductive layer, wherein another one of the high surface energy regions is formed in such a manner as to surround a periphery of a circuit formation region in which a plurality of the conductive layers are formed; and the insulating layer is formed in such a manner as to also cover the another one of the high surface energy regions so that an adhesive guard ring region is formed between the wettability variable layer and the insulating layer.

5 Claims, 22 Drawing Sheets

LAMINATED STRUCTURE AND IMAGE DISPLAY DEVICE

BACKGROUND OF THE INVENTION

1. Field of the Invention

The present invention relates to a laminated structure with an adhesive guard ring, and an image display device.

2. Description of the Related Art

Conventionally, a photolithographic method is performed to form electric wiring in semiconductor devices and electric circuits. With the photolithographic method, fine electric wiring patterns can be formed. However, the photolithographic method involves expensive equipment and complex procedures, which leads to an increase in the manufacturing cost. In order to reduce the manufacturing cost, a technology for forming an electric wiring pattern by directly applying a fine metal particle-dispersed liquid including fine metal particles onto a substrate, is drawing attention in recent years, and various methods are being proposed.

For example, patent document 1 describes the following method. First, a metal paste is formed by uniformly dispersing ultra-fine metal particles referred to as nano-metal ink, each particle having a diameter of 0.001 μm through 0.1 μm, in an organic solvent. Then, the metal paste is applied onto the surface of a substrate, and the coated substrate is dried and baked, thereby forming a metal coating having a thickness of 0.01 μm through 1 μm.

Patent document 2 discloses a laminated structure having fine patterns that can be easily formed, with the use of a wettability variable material whose critical surface tension changes by applying energy. The conductive layer in this laminated structure is made of a fine metal particle-dispersed liquid, with which an electrode can be formed in a high surface energy part having low water repellency on a film made of a wettability variable material. Accordingly, there is no need for expensive equipment and complex manufacturing procedures.

Patent documents 3 and 4 disclose the following semiconductor device. That is, a semiconductor including silicon (Si) is provided with a guard ring made of metal such as copper (Cu), whereby the guard ring extends along the periphery of the chip. This guard ring is provided in case the edge part of the chip is chipped or a crack is formed in an inter-layer insulating film, so as to prevent such damage from extending into a circuit formation region where an electric circuit for a memory or logic is formed.

Patent document 5 discloses a semiconductor device including a guard ring for improving adhering properties of films, and an inter-wiring layer insulating film having low permittivity for providing high-speed performance. Such an inter-layer insulating film having low permittivity contracts significantly due to heat, which degrades adhering properties between the insulating film and a metal film. Furthermore, such an inter-layer insulating film has high moisture-absorption properties, which leads to metal corrosion or detachment of the film. The guard ring structure of the semiconductor device can prevent these disadvantages.

Patent Document 1: Japanese Laid-Open Patent Application No. H03-281783

Patent Document 2: Japanese Laid-Open Patent Application No. 2005-310962

Patent Document 3: Japanese Laid-Open Patent Application No. H09-45766

Patent Document 4: Japanese Laid-Open Patent Application No. 2004-304124

Patent Document 5: Japanese Laid-Open Patent Application No. 2006-303545

However, the method described in patent document 1 has a problem in that the metal wiring, which is formed with a fine metal particle-dispersed liquid in which fine metal particles referred to as nano-metal ink are dispersed in water or an organic solvent, has a lower adhering property with respect to the substrate acting as a base, than that of metal wiring formed by a conventional vacuum deposition method or a sputtering method.

The method described in patent document 2 is advantageous in that a low surface energy part on a wettability variable material has high water repellency and thus has low moisture-absorption properties. However, due to this high water repellency, a film formed on the wettability variable material may have low adhering properties, which causes the film to be detached. Furthermore, moisture may enter through edge faces into the interface of the wettability variable material and the film formed on the wettability variable material, thereby degrading the reliability of the semiconductor device formed inside.

The methods described in patent documents 3, 4, and 5 are for forming a guard ring structure having a via that electrically connects the top and bottom wiring layers. In this structure, the via is embedded in the interlayer insulating film, and walls are formed by the wiring layers, which is a complex structure. In order to form such a guard ring with a semiconductor material including silicon, a photolithographic method needs to be performed, which requires expensive equipment and complex procedures, which leads to an increase in the manufacturing cost for the semiconductor device. Furthermore, the guard ring described in these documents does not prevent moisture from entering through edge faces, and thus cannot prevent the semiconductor device from degrading due to moisture.

SUMMARY OF THE INVENTION

The present invention provides a laminated structure and an image display device, in which one or more of the above-described disadvantages are eliminated.

A preferred embodiment of the present invention provides a laminated structure including a highly-adhesive guard ring capable of preventing moisture from entering, whereby the guard ring can be formed at low cost within a short period of time without the use of expensive equipment, and an image display device.

According to an aspect of the present invention, there is provided a laminated structure including a substrate; a wettability variable layer formed on the substrate, including a material whose critical surface tension varies by receiving energy so as to change from a low surface energy state to a high surface energy state, wherein high surface energy regions, generated by receiving the energy, and low surface energy regions are formed on the wettability variable layer; a conductive layer formed in one of the high surface energy regions on the wettability variable layer; and an insulating layer formed in such a manner as to cover the conductive layer, wherein, another one of the high surface energy regions is formed on the wettability variable layer in such a manner as to surround a periphery of a circuit formation region in which a plurality of the conductive layers are formed; and the insulating layer is formed in such a manner as to also cover the other one of the high surface energy regions so that that an adhesive guard ring region is formed between the wettability variable layer and the insulating layer.

According to another aspect of the present invention, there is provided an image display device including a semiconductor device; and an image display element configured to display an image, wherein the semiconductor device includes a laminated structure; a semiconductor layer; and an insulating film, wherein the laminated structure includes a substrate; a wettability variable layer formed on the substrate, including a material whose critical surface tension varies by receiving energy so as to change from a low surface energy state to a high surface energy state, wherein high surface energy regions, generated by receiving the energy, and low surface energy regions are formed on the wettability variable layer; a conductive layer formed in one of the high surface energy regions on the wettability variable layer; and an insulating layer formed in such a manner as to cover the conductive layer, wherein, another one of the high surface energy regions is formed on the wettability variable layer in such a manner as to surround a periphery of a circuit formation region in which a plurality of the conductive layers are formed; and the insulating layer is formed in such a manner as to also cover the other one of the high surface energy regions so that that an adhesive guard ring region is formed between the wettability variable layer and the insulating layer.

According to one embodiment of the present invention, a laminated structure including a highly-adhesive guard ring capable of preventing moisture from entering, whereby the guard ring can be formed at low cost within a short period of time without the use of expensive equipment, and an image display device, are provided.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given, with reference to the accompanying drawings, of embodiments of the present invention.

An adhesive guard ring according to an embodiment of the present invention is adhered, with a strong adhesive force, to the periphery of a circuit formation region as described below, thereby preventing the film from being detached and preventing moisture from entering the circuit formation region. The guard ring is particularly effective if the semiconductor device is susceptible to moisture, such as an organic semiconductor device.

[First Embodiment]

Figure 1:
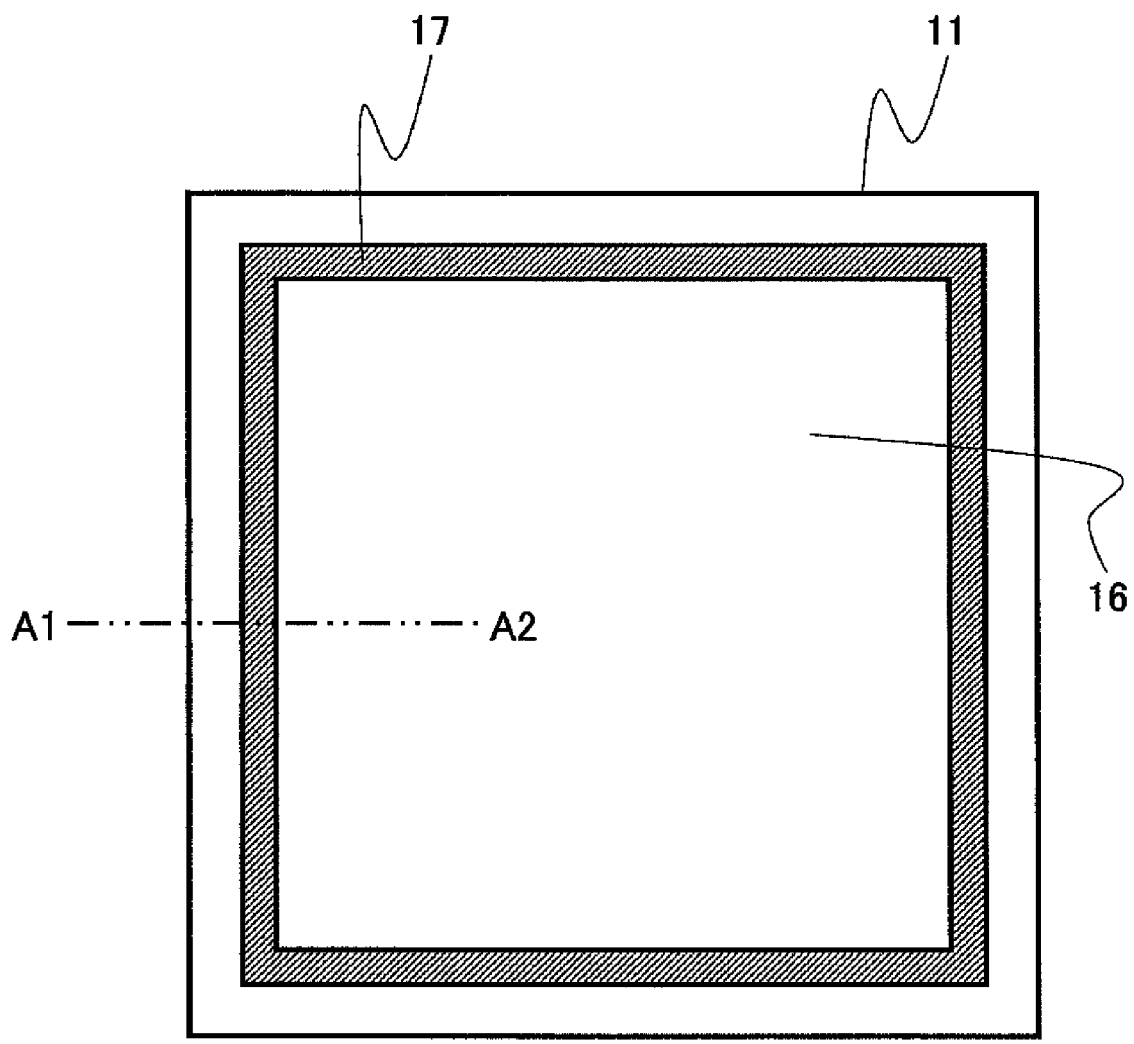
FIG. 1 is a top view of a laminated structure according to a first embodiment of the present invention.
Figure 2:
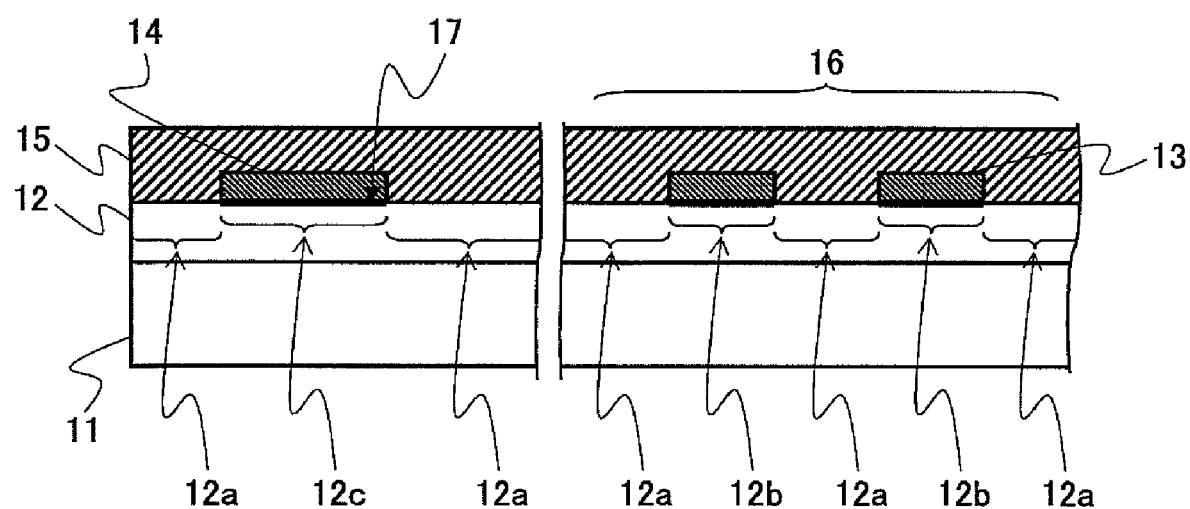
FIG. 2 is a cross-sectional view of the laminated structure according to the first embodiment of the present invention.

A description is given of a first embodiment of the present invention. A laminated structure according to the present embodiment has conductive layers formed on a substrate with an adhesive guard ring region. The present embodiment is described with reference to FIGS. 1 and 2. FIG. 1 is a top view of the laminated structure according to the present embodiment and FIG. 2 is a cross-sectional view taken along a dashed double-dotted line A1-A2 of FIG. 1.

In the laminated structure according to the present embodiment, a wettability variable layer 12 is formed on a substrate 11. On the wettability variable layer 12, conductive layers 13 and a metal layer 14 are formed in a circuit formation region 16. An adhesive guard ring region 17 is formed between the metal layer 14 and the wettability variable layer 12. An insulating layer 15 is formed on top of these layers.

The substrate 11 can be a glass substrate or a film substrate, and is not particularly limited as long as wirings, a semiconductor circuit, and a display device can be formed. Examples of the film substrate are a polyimide (PI) substrate, a polyether sulphone (PES) substrate, a polyethylene terephthalate (PET) substrate, and a polyethylene naphthalate (PEN) substrate.

The wettability variable layer 12 is made of a wettability variable material, whose critical surface tension (surface free energy) changes by applying energy such as heat, ultraviolet rays, electron rays, and plasma. By applying energy to the wettability variable layer 12, at least two regions having different critical surface tension levels are formed, i.e., high surface energy regions 12b and 12c having high critical surface tension, and low surface energy regions 12a having low critical surface tension. Specifically, before applying energy to the wettability variable layer 12, the surface energy is low. By radiating ultraviolet rays to a predetermined region, the region that has been irradiated with the ultraviolet rays changes from a low surface energy state to a high surface energy state, so that the high surface energy regions 12b and 12c are formed.

To form fine patterns, ultraviolet rays and electron rays are preferably used as they have short wavelengths. However, when the material to be irradiated is an organic material, electron rays may damage the material and thereby degrade the insulating properties. Furthermore, a vacuum device would be required, which decreases the throughput. Meanwhile, when ultraviolet rays are radiated onto an organic material, the extent of damage is relatively small, and insulating properties are less degraded. Furthermore, the material can be exposed once with the use of a photomask, which increases throughput. Accordingly, ultraviolet rays are preferably used for radiating energy.

The wettability variable layer 12 according to the present embodiment may be made of one kind of material or a mixture of plural kinds of materials. Furthermore, the wettability variable layer 12 may include a single layer or two or more layers of laminated films. When the wettability variable layer 12 includes laminated films, for example, there may be a layer made of a material with good electric insulation properties to improve the insulating performance, and a layer whose surface free energy changes by a relatively high ratio by receiving energy such as ultraviolet rays. In this case, the respective functions of the wettability variable layer 12 can be implemented by separate layers.

When plural materials are combined to form a single layer film, a material with good electric insulation properties and a material whose surface free energy changes by a relatively high ratio by receiving energy such as ultraviolet rays, can be combined. In this case, the functions can be enhanced by forming a film with a composition gradient in the film-thickness direction.

Such a material having good electric insulating properties may be an organic material or an inorganic material. Examples of an organic material are polyimide, polyamide imide, epoxy resin, silsesquioxane, polyvinyl phenol, polycarbonate, fluorinated resin, polyparaxylylene, and polyvinyl butyral. Polyvinyl phenol and polyvinyl alcohol can be crosslinked with an appropriate cross-linker. Examples of an inorganic material are $SiO_2$ (silica) and $TiO_2$ (titanium oxide).

The material constituting the wettability variable layer 12 may be an organic material or an inorganic material. However, an organic material is preferable when the wettability variable layer 12 is formed by a printing method. Furthermore, to enhance insulating properties, a small amount of an inorganic material may be added to an organic material. A high polymer material having a hydrophobic group in the side-chain of the polymer is an example of an organic material whose surface free energy changes by a relatively high ratio by receiving energy such as ultraviolet rays. Because a hydrophobic group is provided in the side-chain, the surface free energy of the film is low before being irradiated with ultraviolet rays. Therefore, after being irradiated with ultraviolet rays, the difference between hydrophilic properties and repellent properties can be increased, and an electrode can be reliably formed in the intended region.

The material in which the critical surface tension changes has a rigid structure even after the molecular chains have been cut as a result of being irradiated with ultraviolet rays. Therefore, by providing polyimide having good filling properties in the main chain, moisture-absorption properties can be reduced and insulating properties can be enhanced, thereby increasing the reliability of the electric wiring. Examples of polyimide materials are thermosetting polyimide which is created due to a dehydrating condensation reaction caused by heating polyamic acid, and soluble polyimide which is soluble in a solvent. Soluble polyimide can be formed by applying embrocation dissolved in a solvent, and then volatilizing the solvent at a low temperature of less than 200° C. Meanwhile, thermosetting polyimide can be formed by heating the embrocation at a temperature of greater than or equal to 200° C., at which a dehydrating condensation reaction occurs. By using polyimide, it is possible to form a wettability variable layer having high insulating properties, so that high insulating properties can be reliably ensured.

In the present embodiment, the thickness of the wettability variable layer is preferably 30 nm through 3 µm, more preferably 50 nm through 1 µm. If the thickness is less than 30 nm, properties of the bulk body, such as insulating properties, gas barrier properties, and moisture prevention properties may be degraded, and the effects of the present embodiment may not be provided. Meanwhile, if the thickness is greater than or equal to 3 µm, the condition of the surface may change from that of a thinner layer, and the effects of the present embodiment may not be provided.

When a wettability variable layer is formed on an insulating layer, in order to prevent the insulating layer from being affected by ultraviolet rays, the wettability variable layer is preferably made of a material having a greater optical absorption coefficient for ultraviolet rays than that of the insulating material used in the insulating layer.

The conductive layers 13 formed on the high surface energy regions 12b and 12c of the wettability variable layer 12 are formed by applying a soluble metal particle-dispersed liquid, and then firing the wettability variable layer 12. Specifically, the soluble metal particle-dispersed liquid may be constituted by fine metal particles of an alloy of Ag (silver), Al (aluminum), Au (gold), Bi (bismuth), Cu (copper), In (indium), Ni (nickel), Pb (lead), Pd (palladium), Pt (platinum), Sn (tin), Ta (tantalum), Ti (titanium), W (tungsten), and Zn (zinc), or fine particles of silver halide. Particularly, Ag and Cu are preferable as they have low resistance.

These fine particles are used for dispersing the material, and therefore the surfaces of the electric conductors which are the fine particles are coated with an organic substance or a conductive material. The material used for coating the surfaces is preferably conductive. However, a material having insulating properties may also be used, as long as it can be removed by a heating process.

The embrocation including a conductive material can be applied to the surface of the wettability variable layer 12 by a spin coating method, a dip coating method, a screen printing method, an offset printing method, and an inkjet method. In order to form fine patterns by using differences in the surface energy of the wettability variable layer 12, the inkjet method is preferable because smaller liquid droplets can be applied, and the material use efficiency is higher than that of the spin coating method, thereby providing a low-cost process.

The insulating layer 15 is formed by preparing an insulating paste on which various printing methods can be performed. The insulating paste is prepared by mixing a polymer material with a typical solvent, and adding a plasticizer, a filler, and a viscosity adjustor according to need. Examples of the polymer material are polyvinyl alcohol, cellulosic polymer, silicon polymer, polyethylene, polystyrene, polyamide, polymeric polyether, polyvinyl butyral, methacrylate polymer, acrylate polymer, and butyl methacrylate resin. Examples of an organic material for the insulating paste are polyvinylalcohol resin, polyvinyl acetal resin, acrylic resin, and ethyl cellulose resin. Examples of an inorganic material for the insulating paste are $SiO_2$ (silica), $Al_2O_3$ (alumina), $TiO_2$ (titanium oxide), ZnO (zinc oxide), and $BaTiO_3$ (barium titanate). Particularly, $SiO_2$, $Al_2O_3$, and ZnO are preferable materials as they have relatively low dielectric constants.

Examples of the application method for forming the insulating layer 15 are a spin coating method, a die coating method, a screen printing method, an offset printing method, an inkjet method, and a flexo printing method. Particularly, the screen printing method and a gravure printing method are preferable.

In the laminated structure according to the present embodiment having the above structure, the adhesive guard ring region 17 is formed on the same plane as that of the wettability variable layer 12, around the periphery of the circuit formation region 16 where the electric circuit is formed.

Next, a description is given of a manufacturing method of the laminated structure according to the present embodiment with reference to FIGS. 3A through 3D.

Figure 3A:
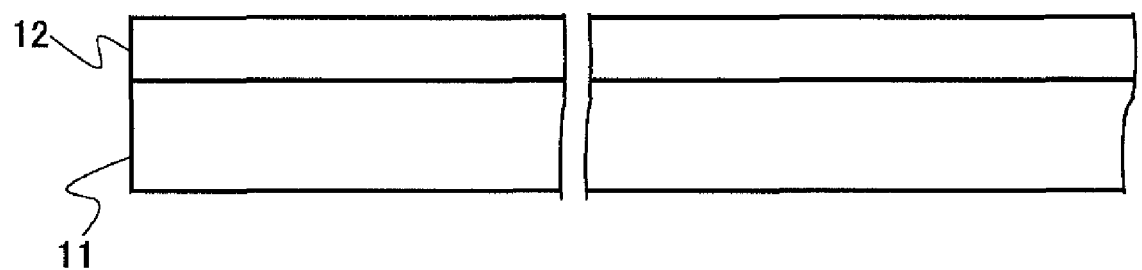
FIGS. 3A through 3D illustrate a manufacturing method of the laminated structure according to the first embodiment of the present invention.

First, as shown in FIG. 3A, the wettability variable layer 12 is formed on the substrate 11 by the above-described method.

Figure 3B:
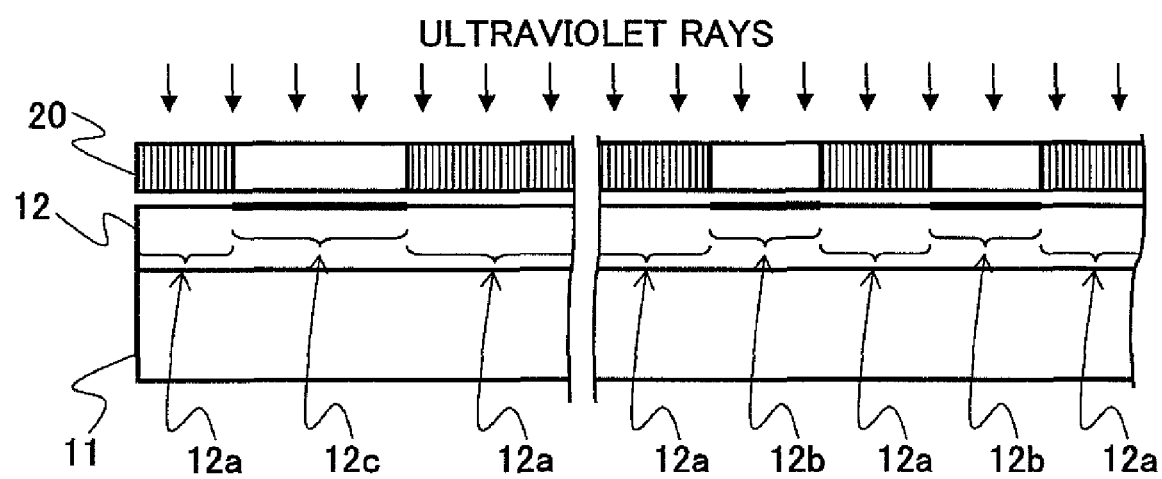

Next, as shown in FIG. 3B, ultraviolet rays are radiated from an exposing device onto the wettability variable layer 12 formed on the substrate 11, with the use of a mask 20. Accordingly, the high surface energy regions 12b and 12c which have been irradiated with the ultraviolet rays, and the low surface energy regions 12a which have not been irradiated with the ultraviolet rays, are formed. The mask 20 has a pattern made of Cr (chromium) formed on a substrate made of glass, for example. The ultraviolet rays are prevented from being radiated onto regions corresponding to the Cr patterns. Accordingly, ultraviolet rays are simultaneously radiated onto the regions for forming the conductive layers 13 which are to act as the electric wiring in the circuit formation region 16, and the region for forming the adhesive guard ring. Consequently, the high surface energy regions 12b and 12c are formed. These regions have a higher degree of wettability than that of the low surface energy regions 12a that have not been irradiated with ultraviolet rays.

Figure 3C:
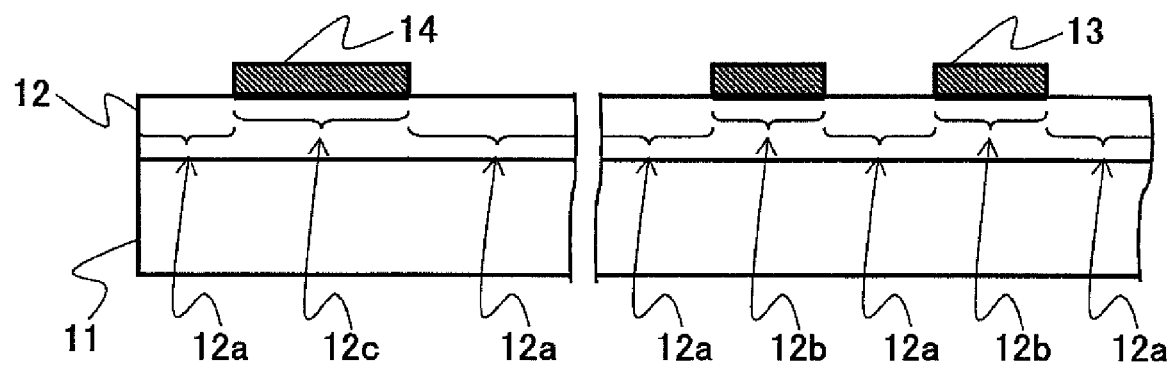

Next, as shown in FIG. 3C, by applying the above-described soluble fine metal particle-dispersed liquid, the fine metal particles concentrate in the high surface energy regions 12b and 12c. Subsequently, a firing procedure is performed to form the conductive layers 13 which are to act as the electric wiring for forming the circuit in the circuit formation region 16. Around the periphery of the circuit formation region 16, the metal layer 14 is formed for forming the adhesive guard ring region 17.

Figure 3D:
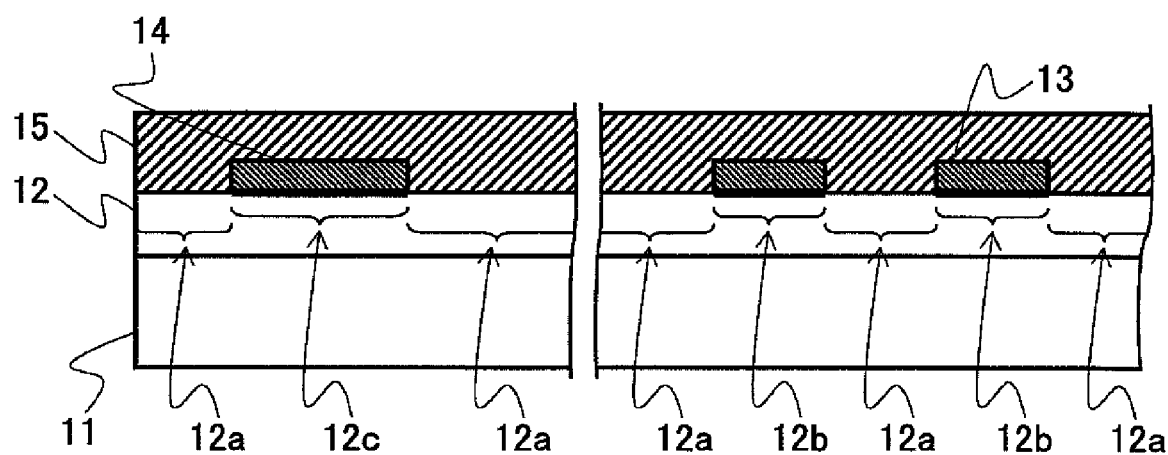

Next, as shown in FIG. 3D, the insulating layer 15 is formed so as to cover the conductive layers 13 and the metal layer 14. Accordingly, the laminated structure according to the present embodiment is fabricated.

As described in the present embodiment, the conductive layers 13 and the metal layer 14 for forming the adhesive guard ring region 17 can be formed with the use of the same fine metal particle-dispersed liquid or different fine metal particle-dispersed liquids.

The high surface energy regions 12b and 12c of the wettability variable layer 12 have high wettability. Therefore, the adhesiveness of the films formed on the high surface energy regions 12b and 12c is higher than that of the other regions of the wettability variable layer 12 (i.e., the low surface energy regions 12a). Accordingly, by forming the adhesive guard ring region 17 around the periphery of the circuit formation region 16, in the laminated structure, the adhesiveness between the metal layer 14 and the wettability variable layer 12 can be increased, detachment of the film can be prevented, and moisture can be prevented from entering through the edge faces of the laminated structure. By forming the metal layer 14 in the adhesive guard ring region 17, moisture can be prevented from entering this region, thereby further preventing moisture from entering through the edge faces of the laminated structure.

In the present embodiment, the width of the adhesive guard ring region 17 is to be greater than or equal to 1 µm in order to prevent moisture from entering and to retain adhesiveness.

[Second Embodiment]

A description is given of a second embodiment according to the present invention. The laminated structure according to the second embodiment has conductive layers formed on a substrate having an adhesive guard ring region. Unlike the first embodiment, a metal layer is not formed in the adhesive guard ring region.

Figure 4:
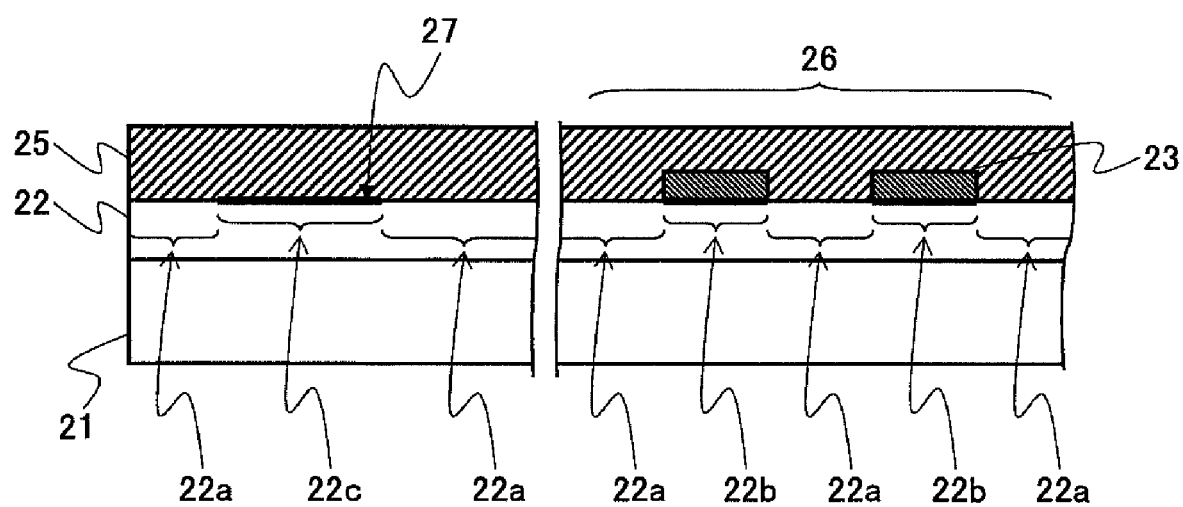
FIG. 4 is a cross-sectional view of a laminated structure according to a second embodiment of the present invention.

As shown in FIG. 4, in the laminated structure according to the present embodiment, a wettability variable layer 22 is formed on a substrate 21, and conductive layers 23 are formed in a circuit formation region 26 on the wettability variable layer 22. The part of the wettability variable layer 22 located in an adhesive guard ring region 27 corresponds to a high surface energy region 22c. An insulating layer 25 is formed on the high surface energy region 22c and the conductive layers 23.

In the laminated structure according to the present embodiment, the adhesive guard ring region 27 is formed in between the high surface energy region 22c of the wettability variable layer 22 and the insulating layer 25, around the periphery of the circuit formation region 26 in which the electric circuit is formed.

Next, a description is given of a manufacturing method of the laminated structure according to the present embodiment with reference to FIGS. 5A through 5D. The film forming methods and the materials are the same as those of the first embodiment.

Figure 5A:
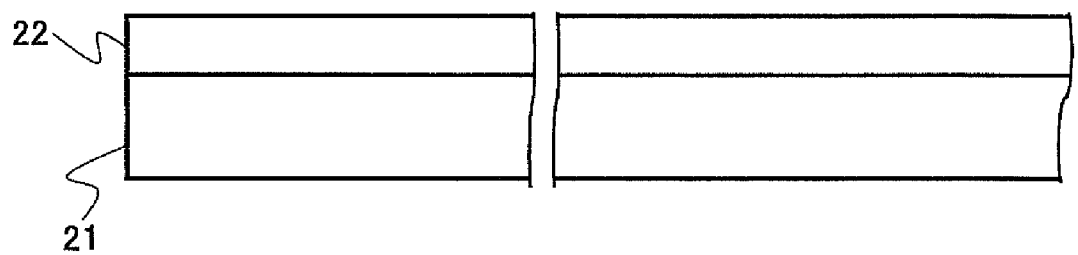
FIGS. 5A through 5D illustrate a manufacturing method of the laminated structure according to the second embodiment of the present invention.

First, as shown in FIG. 5A, the wettability variable layer 22 is formed on the substrate 21 by the above-described method.

Figure 5B:
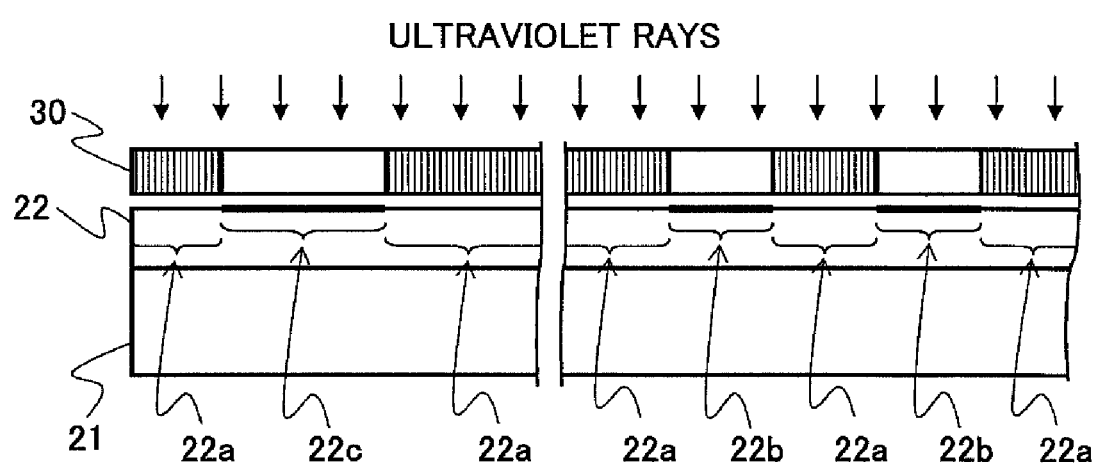

Next, as shown in FIG. 5B, ultraviolet rays are radiated from an exposing device onto the wettability variable layer 22 formed on the substrate 21, with the use of a mask 30. Accordingly, the high surface energy regions 22b and 22c which have been irradiated with the ultraviolet rays, and low surface energy regions 22a which have not been irradiated with the ultraviolet rays, are formed. The mask 30 has a pattern made of Cr (chromium) formed on a substrate made of glass, for example. The ultraviolet rays are prevented from being radiated onto regions corresponding to the Cr patterns.

Accordingly, ultraviolet rays are simultaneously radiated onto the regions for forming the conductive layers 23 which are to act as the electric wiring in the circuit formation region 26, and the region for forming the adhesive guard ring. Consequently, the high surface energy regions 22b and 22c are formed. These regions have a higher degree of wettability than that of the low surface energy regions 22a that have not been irradiated with ultraviolet rays.

Figure 5C:
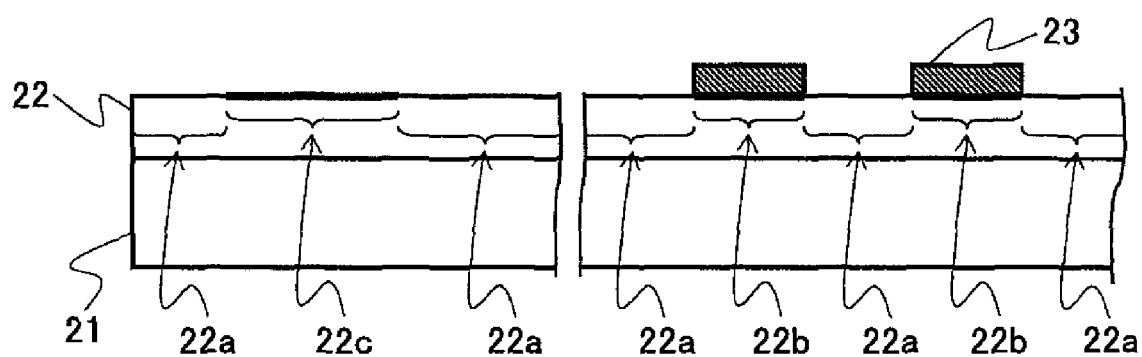

Next, as shown in FIG. 5C, by applying the above-described soluble fine metal particle-dispersed liquid, the fine metal particles concentrate in the high surface energy regions 22b. Subsequently, a firing procedure is performed to form the conductive layers 23 which are to act as the electric wiring for forming the circuit in the circuit formation region 26.

Figure 5D:
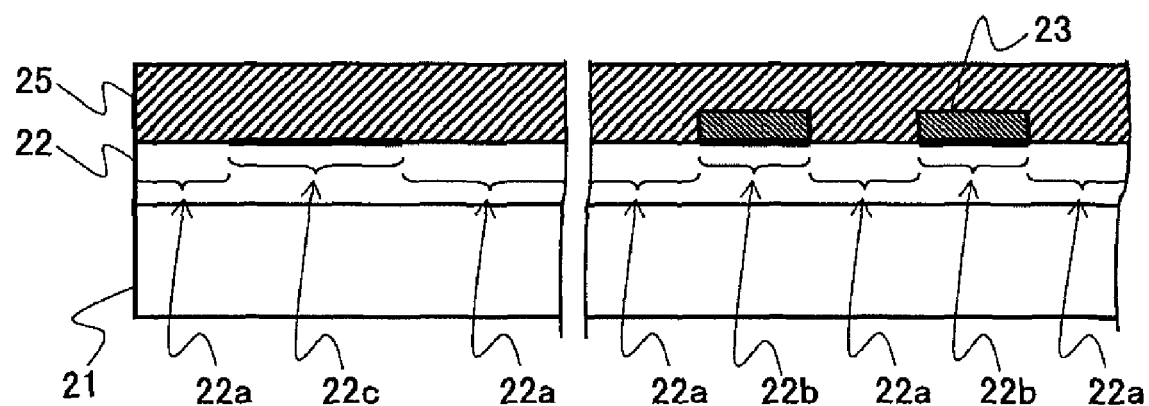

Next, as shown in FIG. 5D, the insulating layer 25 is formed so as to cover the conductive layers 23 and the high surface energy region 22c of the wettability variable layer 22. Accordingly, the laminated structure according to the present embodiment is fabricated.

As described in the present embodiment, the adhesive guard ring region 27 is formed between the wettability variable layer 22 and the insulating layer 25 by forming the insulating layer 25 on the high surface energy region 22c of the wettability variable layer 22. That is, the high surface energy region 22c of the wettability variable layer 22 has higher wettability than that of the low surface energy regions 22a. Therefore, when a film is formed in the high surface energy region 22c, high adhesiveness can be attained with a strong adhesive force. Accordingly, by forming the insulating layer 25 on the high surface energy region 22c of the wettability variable layer 22, the adhesive guard ring region 27 is formed.

A metal layer is not formed in the adhesive guard ring region 27 in the present embodiment, and therefore the manufacturing process is simplified and the material use efficiency of the metal material can be enhanced.

In the present embodiment, the width of the adhesive guard ring region 27 is to be greater than or equal to 1 μm in order to prevent moisture from entering and to retain adhesiveness.

[Third Embodiment]

Next, a description is given of a third embodiment. The present embodiment pertains to the layout of the adhesive guard ring regions. The present embodiment is described with reference to FIGS. 6A and 6B.

Figure 6A:
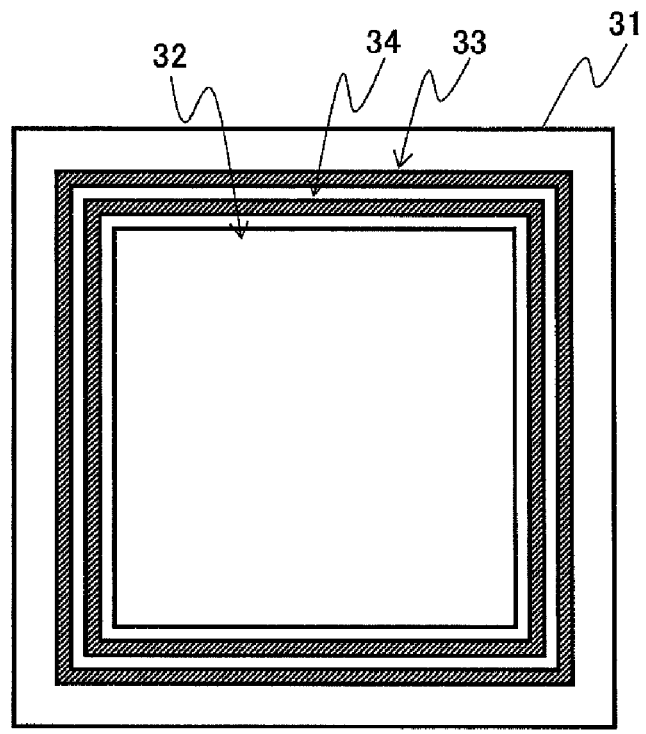
FIGS. 6A and 6B are top views of laminating structures according to a third embodiment of the present invention.

FIG. 6A is a top view of a laminated structure with adhesive guard ring regions provided in a two-tiered manner. Specifically, a first adhesive guard ring region 33 and a second adhesive guard ring region 34 are formed so as to surround a circuit formation region 32 on a substrate 31. By providing adhesive guard ring regions in a two-tiered manner, the adhesiveness can be further enhanced, and even in the event that either the first adhesive guard ring region 33 or the second adhesive guard ring region 34 becomes defective, moisture can be prevented from entering through the interface of the wettability variable layer and the insulating layer. The first adhesive guard ring region 33 and the second adhesive guard ring region 34 according to the present embodiment are applicable to the configuration according to the first embodiment or the configuration according to the second embodiment.

Figure 6B:
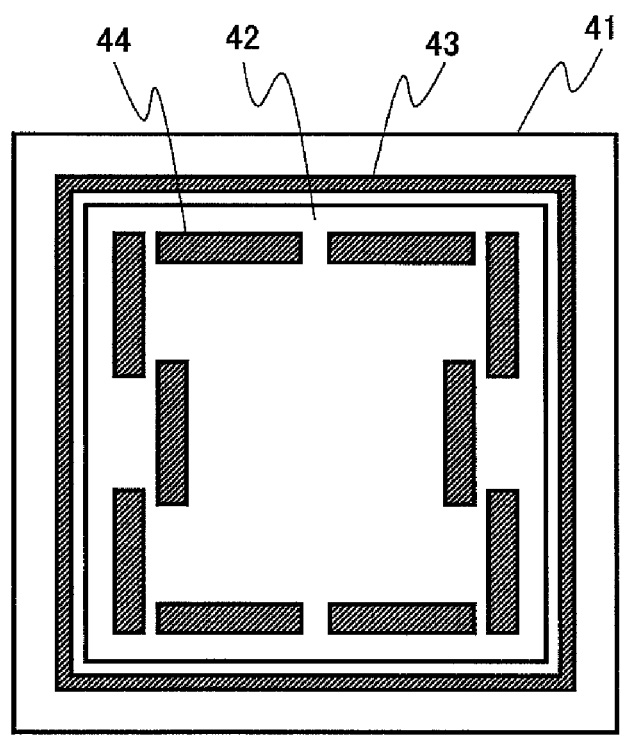

FIG. 6B illustrates an example where adhesive reinforcing regions are provided inside the circuit formation region, in addition to the adhesive guard ring region according to the above embodiments. Specifically, an adhesive guard ring region 43 is formed so as to surround a circuit formation region 42 on a substrate 41. At the same time, adhesive reinforcing regions 44 are formed inside the circuit formation region 42. When the adhesiveness may be insufficient with only the adhesive guard ring region 43, and there is not enough space for forming adhesive guard ring regions in a two-tiered manner as shown in FIG. 6A, by forming the adhesive reinforcing regions 44 in the circuit formation region 42, the adhesiveness can be improved. The adhesive reinforcing regions 44 can be formed by the same process as that for forming the circuit formation region 42, and therefore the number of procedures does not increase. The adhesive guard ring region 43 and the adhesive reinforcing regions 44 according to the present embodiment are applicable to the configuration according to the first embodiment or the configuration according to the second embodiment.

[Fourth Embodiment]

Next, a description is given of a fourth embodiment. A semiconductor device according to the present embodiment has dummy patterns and an adhesive guard ring region.

A description is given of a manufacturing method of the semiconductor device according to the present embodiment with reference to FIGS. 7A through 10.

Figure 7A:
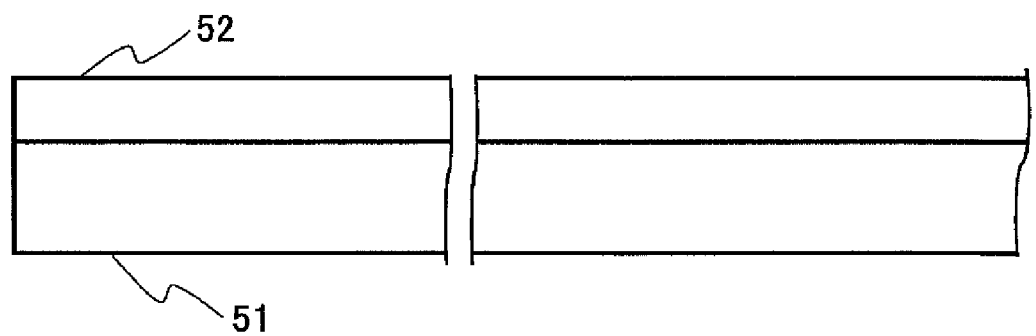
FIGS. 7A through 7D illustrate a manufacturing method (part 1) of a laminated structure according to a fourth embodiment of the present invention.

First, as shown in FIG. 7A, a first wettability variable layer 52 is formed on a film substrate 51. Specifically, an NMP solution including thermosetting polyimide having a hydrophobic group in the side-chain is applied onto the film substrate 51 by a spin coating method, to form the first wettability variable layer 52 having a film thickness of 50 nm.

Figure 7B:
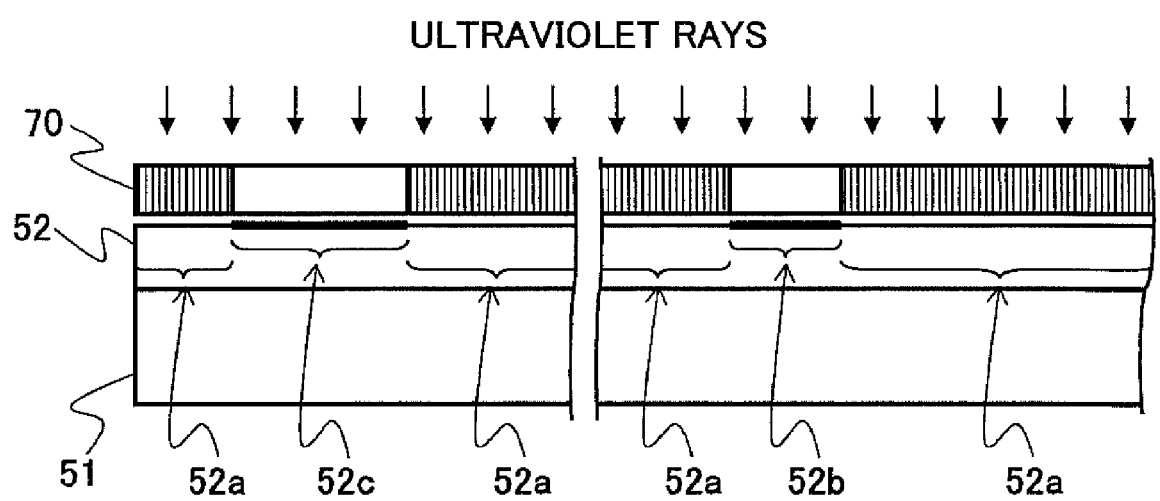

Next, as shown in FIG. 7B, ultraviolet rays are radiated from an exposing device. Specifically, an exposing device (not shown) including an extra-high pressure mercury lamp having a wavelength of less than or equal to 300 nm as the light source, performs the exposure via a photomask 70. The radiation amount of ultraviolet rays is approximately 8 J/cm$^2$. An exposure pattern is formed on the photomask 70, and ultraviolet rays are radiated onto the first wettability variable layer 52 in accordance with this exposure pattern. Accordingly, low surface energy regions 52a which have not been irradiated with the ultraviolet rays, and high surface energy regions 52b and 52c which have been irradiated with the ultraviolet rays, are formed on the first wettability variable layer 52. A gate electrode is formed in the high surface energy region 52b as described below. An adhesive guard ring region is formed in the high surface energy region 52c as described below.

Figure 7C:
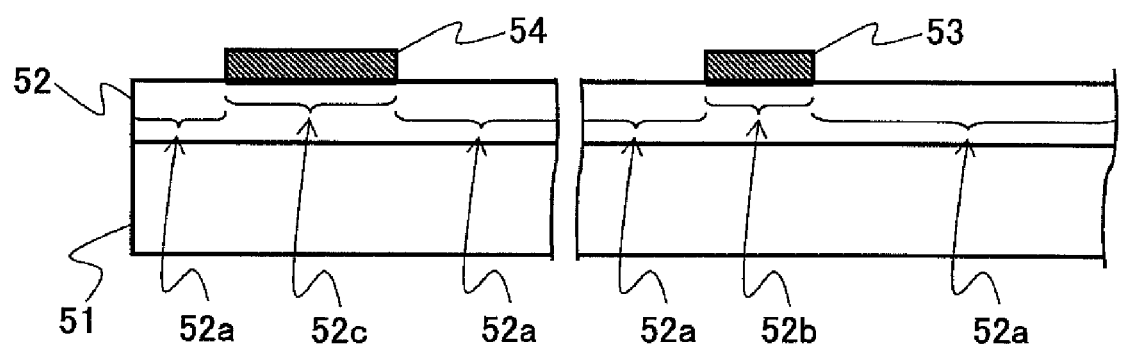

Next, as shown in FIG. 7C, by applying a fine metal particle-dispersed liquid on the first wettability variable layer 52, a gate electrode 53 and a metal layer 54 are formed. Specifically, the fine metal particle-dispersed liquid obtained by diffusing Ag fine particles in a soluble solvent, is applied on the first wettability variable layer 52 by an inkjet method. The Ag fine particles in the applied fine metal particle-dispersed liquid concentrate in the high surface energy regions 52b and 52c of the first wettability variable layer 52. Subsequently, a firing procedure is performed at 180° C. to form the gate electrode 53 having a film thickness of 100 nm and a width of 50 μm, and the metal layer 54 for forming an adhesive guard ring region having a film thickness of 100 nm and a width of 500 μm.

Figure 7D:
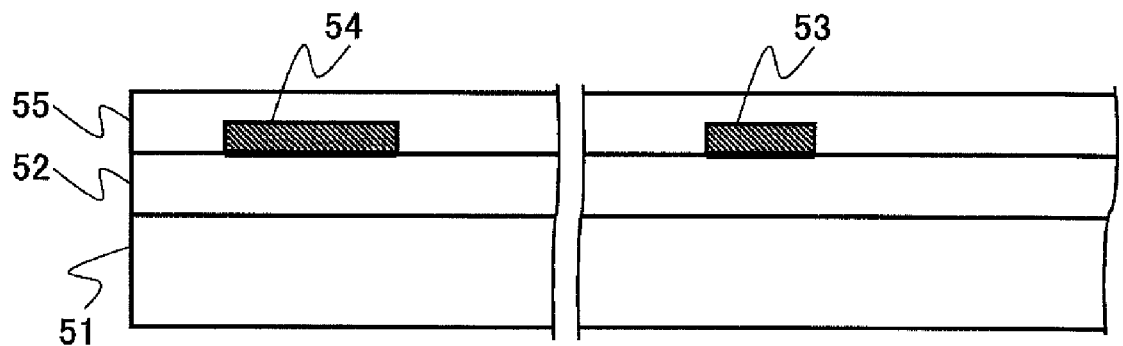

Next, as shown in FIG. 7D, a second wettability variable layer 55 is formed on the first wettability variable layer 52 on which the gate electrode 53 and the metal layer 54 are formed. Specifically, an NMP mixed solution including a polyimide solution PI100 (Maruzen Petrochemical Co., Ltd.) and soluble polyimide with a side-chain having a different structure from that of the material used for forming the first wettability variable layer 52, is applied by a spin coating method. This is baked at 180° C. to form the second wettability variable layer 55 having a thickness of 500 nm. The soluble polyimide used for forming the second wettability variable layer 55 does not have a side-chain for controlling the wettability; the soluble polyimide is a polyimide material that is imidized by copolymerizing a polyamic acid having only a main chain and a polyamic acid with a side chain having low surface energy before receiving energy, whereby the side chain is configured to control the main chain and wettability. Furthermore, polyimide solution PI100 has good insulating properties, and thus has a function of a gate insulating film in the semiconductor device that is formed as described below.

Figure 8A:
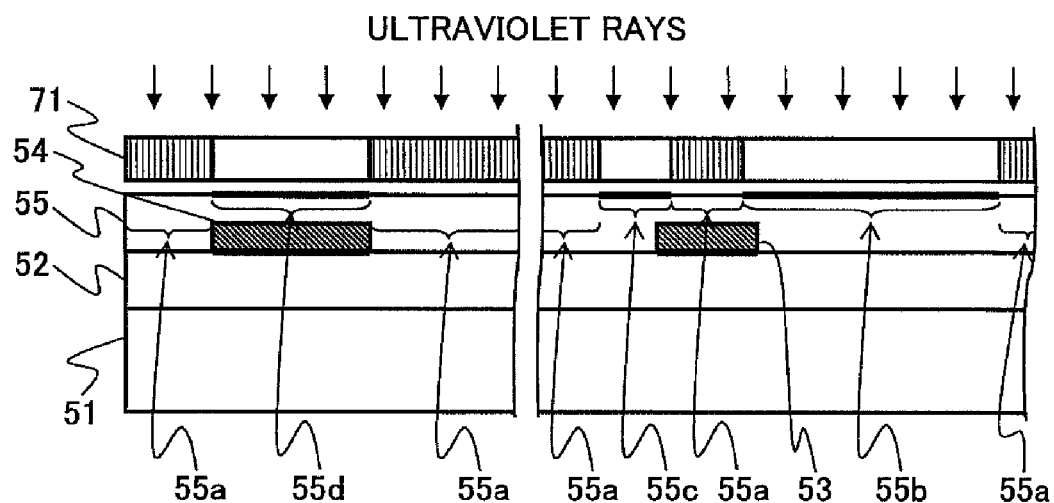
FIGS. 8A through 8C illustrate a manufacturing method (part 2) of the laminated structure according to the fourth embodiment of the present invention.

Next, as shown in FIG. 8A, ultraviolet rays are radiated from an exposing device. Specifically, an exposing device (not shown) including an extra-high pressure mercury lamp having a wavelength of less than or equal to 300 nm as the light source, performs the exposure via a photomask 71. The radiation amount of ultraviolet rays is approximately 5 J/cm$^2$. An exposure pattern is formed on the photomask 71, and ultraviolet rays are radiated onto the second wettability variable layer 55 in accordance with this exposure pattern. Accordingly, low surface energy regions 55a which have not been irradiated with the ultraviolet rays, and high surface energy regions 55b, 55c, and 55d which have been irradiated with the ultraviolet rays, are formed on the second wettability variable layer 55. A source electrode and a drain electrode are formed in the high surface energy regions 55b and 55c, respectively, and an adhesive guard ring region described below is formed in the high surface energy region 55*d*.

Figure 8B:
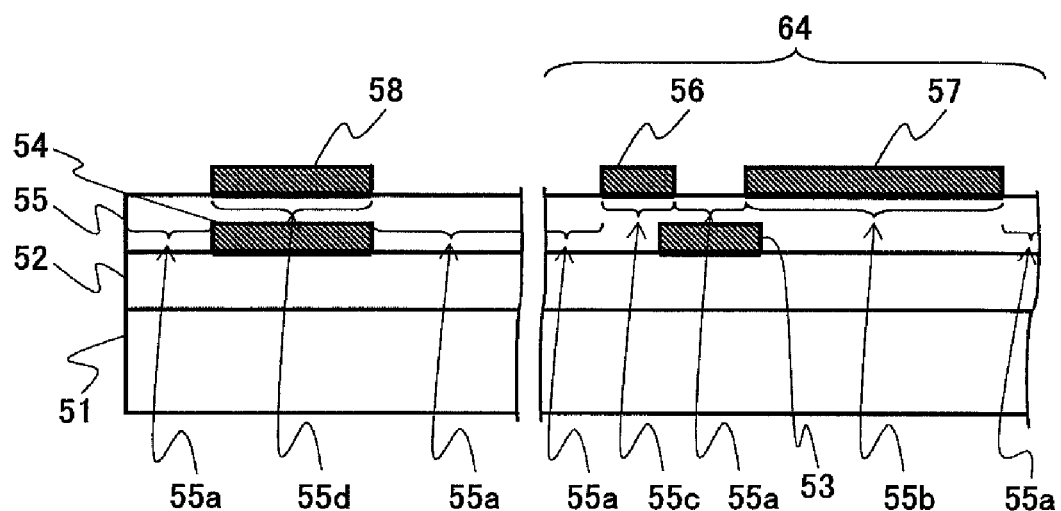

Next, as shown in FIG. 8B, by applying a fine metal particle-dispersed liquid on the second wettability variable layer 55, a source electrode 56, a drain electrode 57, and a metal layer 58 are formed. Specifically, the fine metal particle-dispersed liquid obtained by diffusing Ag fine particles in a soluble solvent, is applied on the second wettability variable layer 55 by an inkjet method. The Ag fine particles in the applied fine metal particle-dispersed liquid concentrate in the high surface energy regions 55*b*, 55*c*, and 55*d* of the second wettability variable layer 55. Subsequently, a firing procedure is performed at 180° C. to form the source electrode 56, the drain electrode 57, and the metal layer 58. In a circuit formation region 64, the source electrode 56 has a width of 50 µm, and the drain electrode 57 is formed so that the channel space is 5 µm.

Figure 9:
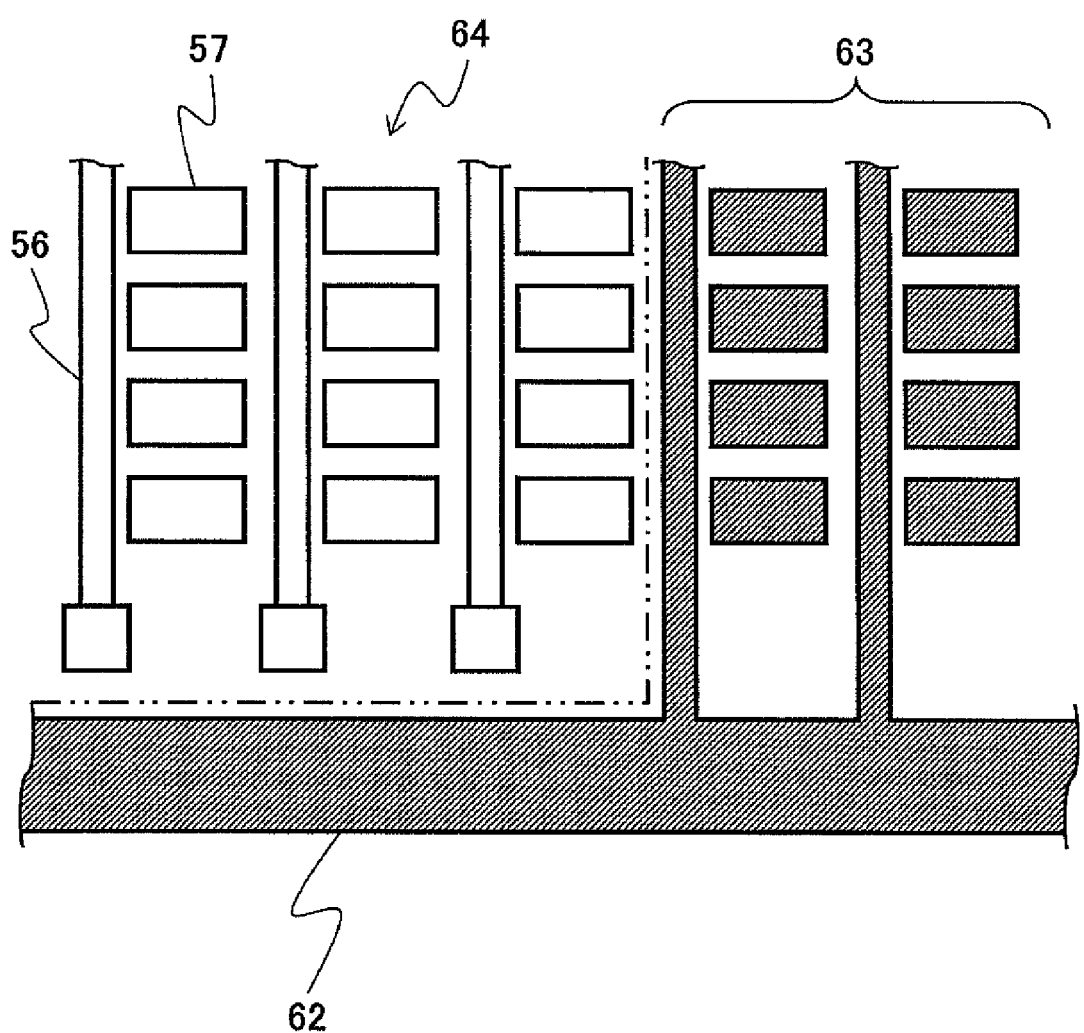
FIG. 9 is a top view of a semiconductor device according to the fourth embodiment of the present invention.

Meanwhile, dummy patterns 62 and 63 are formed around the periphery of the circuit formation region 64, which are similar to the patterns formed in the circuit formation region 64. As shown in FIG. 9, the dummy patterns 62 and 63 also act as adhesive guard ring regions. Specifically, five patterns are formed, each having a width of 200 µm (only two patterns are illustrated in FIG. 9 as a matter of simplification). By forming the dummy patterns 62 and 63 that also act as adhesive guard ring regions, there is no need to perform a special procedure for forming adhesive guard ring regions, thereby enhancing manufacturing efficiency. Furthermore, by forming the dummy patterns 62 and 63, the shape of the semiconductor device can be prevented from being defective in a drying process, thereby forming the source electrode 56 and the drain electrode 57 with less contact failures.

Figure 8C:
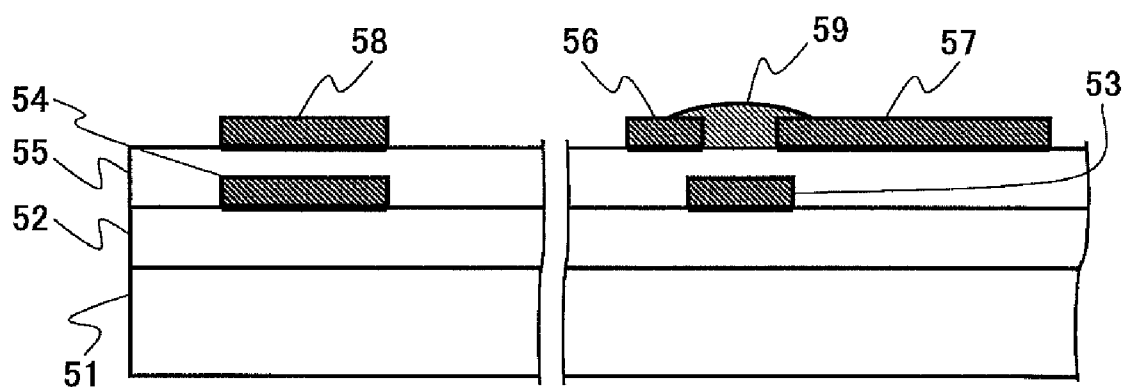

Next, as shown in FIG. 8C, an organic semiconductor layer 59 is formed. Specifically, an embrocation is made by dissolving triarylamine, which is an organic semiconductor having the structural formula of chemical formula I, in a mixed solvent of xylene and mesitylene. This embrocation is jetted onto a region corresponding to the channel between the source electrode 56 and the drain electrode 57 by an inkjet method. Then, the embrocation is dried at a temperature of 120° C. to form the organic semiconductor layer 59 having a thickness of 30 nm.

Figure 10:
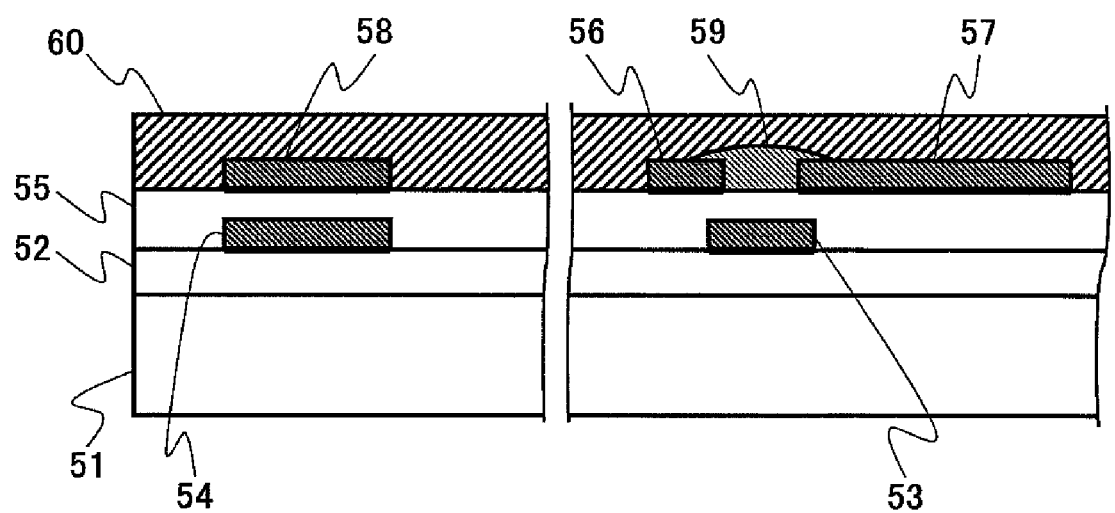
FIG. 10 is a cross-sectional view of the laminated structure according to the fourth embodiment of the present invention.

Next, as shown in FIG. 10, an insulating film 60 is formed on the surface on which the organic semiconductor layer 59 has been formed. Specifically, an insulating material is used, which is prepared by mixing together a polyvinyl acetal resin and silica particles at a polymerization ratio of 1:2, and then turning the mixture into a paste. Then, printing is performed by a screen printing method. A pattern is formed on the screen plate in such a manner that an opening is formed at a power source supplying unit (not shown). Subsequently, the insulating material is dried for an hour at a temperature of 100° C., to form the insulating film 60 having a film thickness of 2 µm.

Figure 11A:
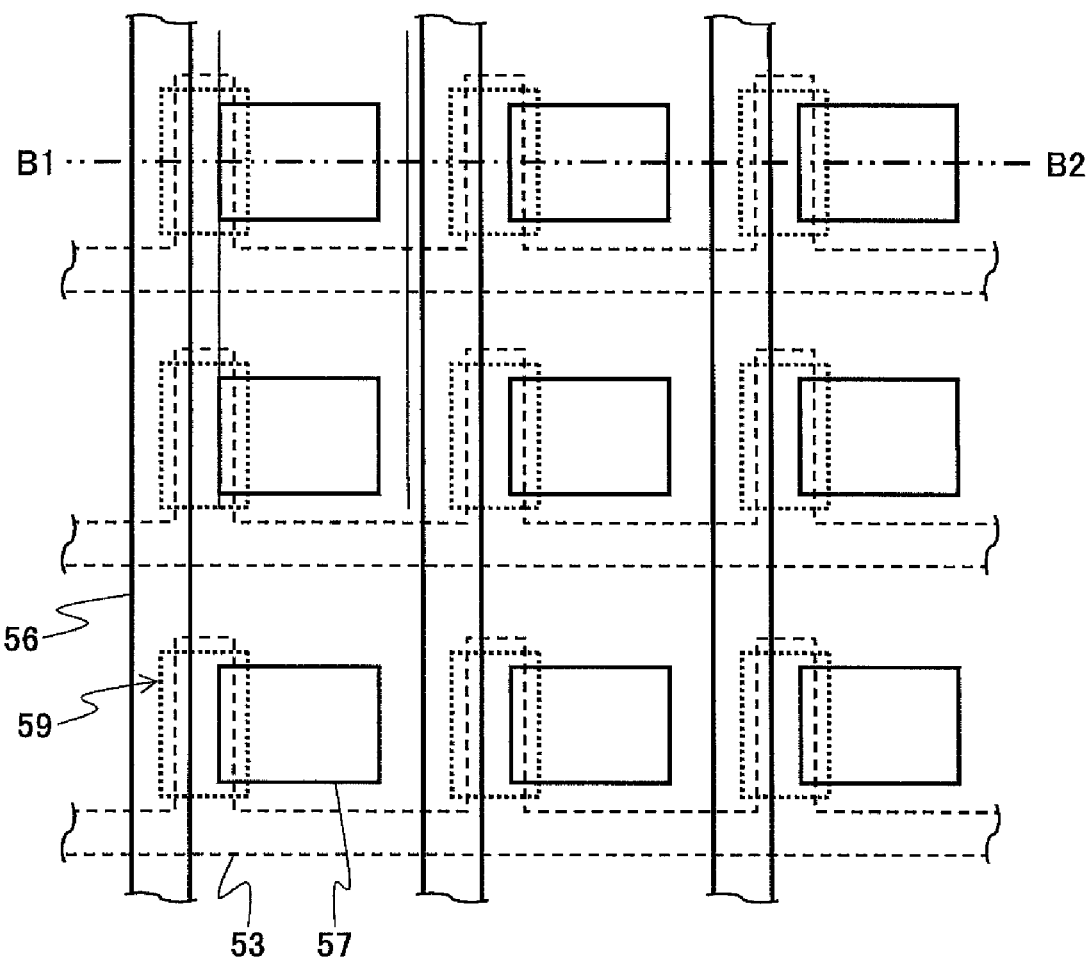
FIGS. 11A and 11B schematically illustrate the semiconductor device according to the fourth embodiment of the present invention.
Figure 11B:
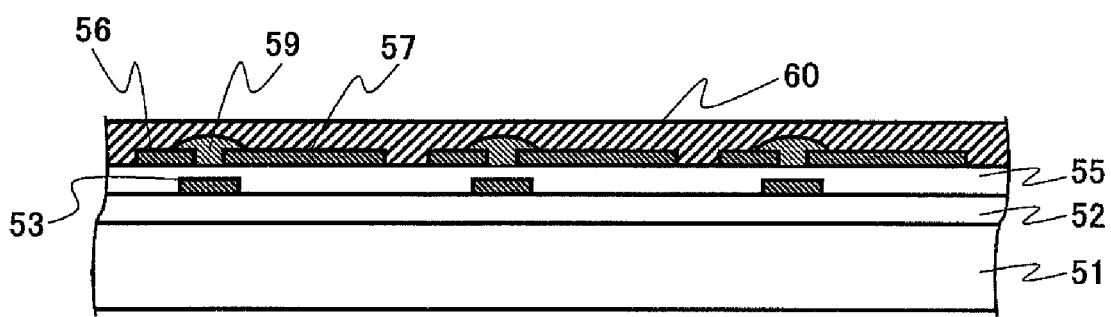

Accordingly, the semiconductor device shown in FIG. 10 is fabricated. FIGS. 11A and 11B illustrate a semiconductor device in which plural organic transistors fabricated in the above-described manner are arranged in an array. FIGS. 11A and 11B do not illustrate the adhesive guard ring regions. FIG. 11A is a schematic top view of the electric wiring of the semiconductor device according to the present embodiment. FIG. 11B is a cross-sectional view taken along a dashed double-dotted line B1-B2 of FIG. 11A. Although not shown in FIGS. 11A and 11B, 200×200 organic transistors are formed in a two-dimensional array at an inter-element pitch of 212 µm. Each of these organic transistors include the second wettability variable layer 55 acting as a gate insulating film, the source electrode 56, the drain electrode 57, and the organic semiconductor layer 59 formed on the film substrate 51. The average mobility of the organic transistors is $1.3 \times 10^{-3}$ cm$^2$/Vs.

In the present embodiment, the first wettability variable layer 52, the second wettability variable layer 55, the gate electrode 53, the source electrode 56, the drain electrode 57, the metal layers 54 and 58, and the insulating film 60 can be formed by a printing method, and therefore the semiconductor device can be fabricated at low cost. Furthermore, the dummy patterns also act as the adhesive guard ring regions, and therefore the films such as the insulating film can be prevented from being detached from the periphery of the semiconductor device, and moisture can be prevented from entering through the edge faces of the semiconductor device, without the need for a special procedure.

In the present embodiment, a high polymer organic semiconductor material expressed by the chemical formula I is used for the semiconductor layer. However, it is also possible to use other inorganic semiconductors and organic semiconductors. Examples of inorganic semiconductors are CdSe, CdTe, and Si. Examples of organic semiconductors are an organic low molecular type such as pentacene, anthracene,

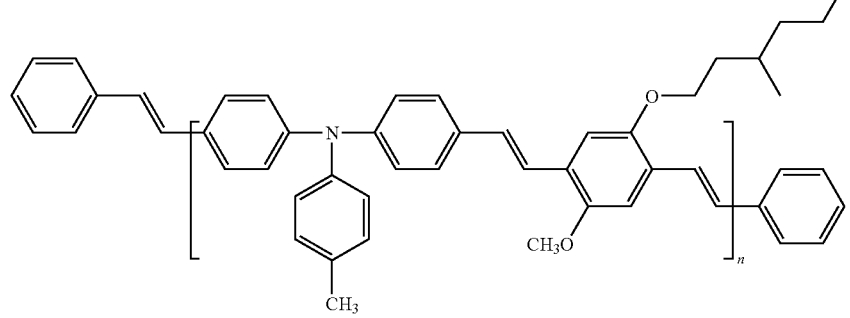

Chemical formula 1 tetracene, and phthalocyanine; a polyacetylene conductive polymer; a polyphenylene conductive polymer such as poly-para-phenylene and derivatives thereof and poly-phenylene vinylene and derivatives thereof; a heterocyclic conductive polymer such as polyfuran; and an ionic conductive polymer such as polyaniline and derivatives thereof. Particularly, an organic semiconductor with which printing can be performed with a low-cost process is preferably used.

[Fifth Embodiment]

Next, a description is given of a fifth embodiment. A semiconductor device according to the fifth embodiment has a different configuration from that of the fourth embodiment.

A description is given of a manufacturing method of the semiconductor device according to the present embodiment with reference to FIGS. 12A through 14B.

Figure 12A:
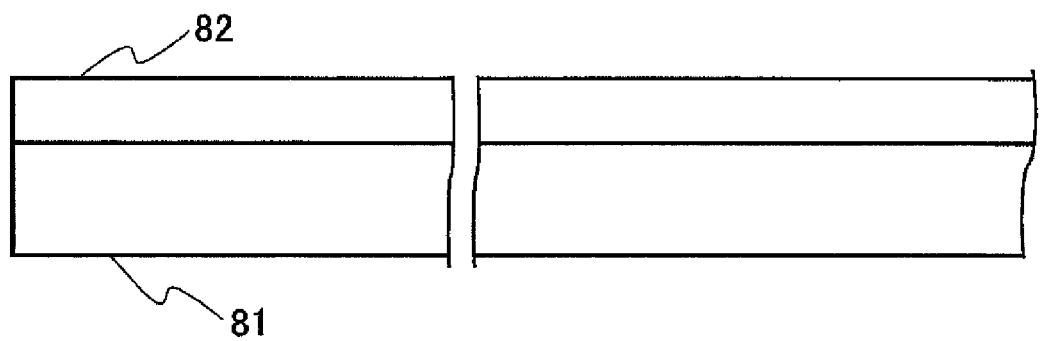
FIGS. 12A through 12D illustrate a manufacturing method (part 1) of a laminated structure according to a fifth embodiment of the present invention.

First, as shown in FIG. 12A, a first wettability variable layer 82 is formed on a film substrate 81. Specifically, an NMP solution including thermosetting polyimide having a hydrophobic group in the side-chain is applied onto the film substrate 81 by a spin coating method, to form the first wettability variable layer 82 having a film thickness of 50 nm.

Figure 12B:
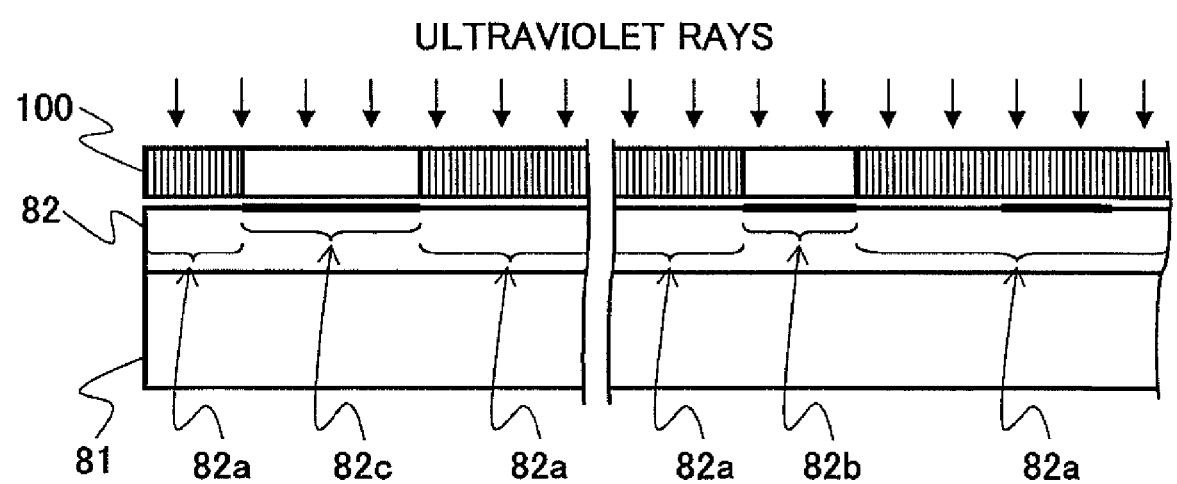

Next, as shown in FIG. 12B, ultraviolet rays are radiated from an exposing device. Specifically, an exposing device (not shown) including an extra-high pressure mercury lamp having a wavelength of less than or equal to 300 nm as the light source, performs the exposure via a photomask 100. The radiation amount of ultraviolet rays is approximately 8 J/cm$^2$. An exposure pattern is formed on the photomask 100, and ultraviolet rays are radiated onto the first wettability variable layer 82 in accordance with this exposure pattern. Accordingly, low surface energy regions 82a which have not been irradiated with the ultraviolet rays, and high surface energy regions 82b and 82c which have been irradiated with the ultraviolet rays, are formed on the first wettability variable layer 82. A gate electrode is formed in the high surface energy region 82b as described below. An adhesive guard ring region is formed in the high surface energy region 82c as described below. In order to increase adhesiveness, adhesive reinforcing regions may be formed. The adhesive reinforcing regions are provided as follows. That is, when the first wettability variable layer 82 is irradiated with ultraviolet rays, the parts where the adhesive reinforcing regions are to be formed are also irradiated with ultraviolet rays, so that these parts on the first wettability variable layer 82 become high surface energy parts, and the adhesiveness between the high surface energy parts and the film formed on these parts is increased. As described in the third embodiment, metal layers can be formed on the adhesive reinforcing regions which have been irradiated with ultraviolet rays.

Figure 12C:
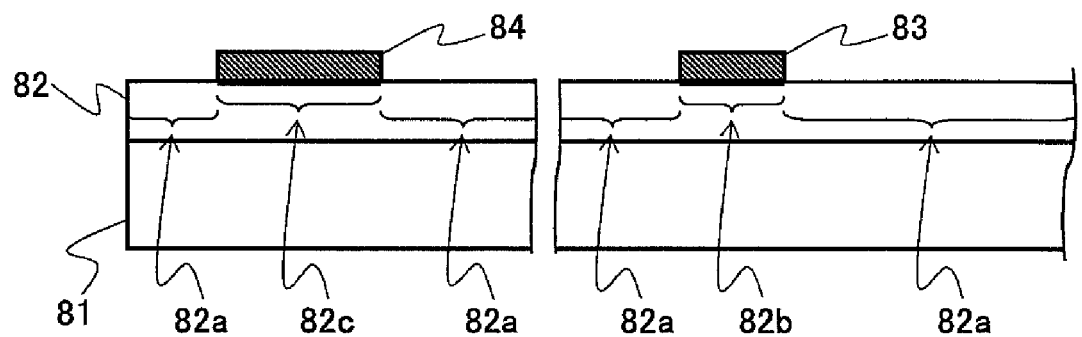

Next, as shown in FIG. 12C, by applying a fine metal particle-dispersed liquid on the first wettability variable layer 82, a gate electrode 83 and a metal layer 84 are formed. Specifically, the fine metal particle-dispersed liquid obtained by diffusing Ag fine particles in a soluble solvent, is applied on the first wettability variable layer 82 by an inkjet method. The Ag fine particles in the applied fine metal particle-dispersed liquid concentrate in the high surface energy regions 82b and 82c of the first wettability variable layer 82. Subsequently, a firing procedure is performed at 180° C. to form the gate electrode 83 having a film thickness of 100 nm and a width of 50 μm, and the metal layer 84 for forming an adhesive guard ring region having a film thickness of 100 nm and a width of 500 μm.

Figure 12D:
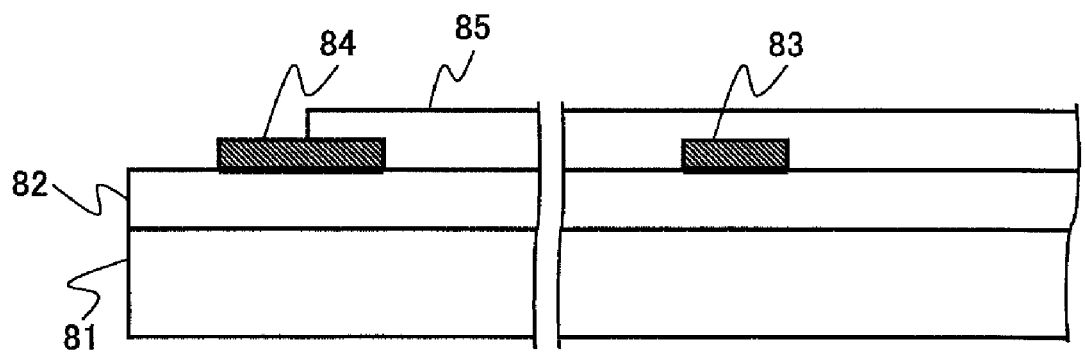

Next, as shown in FIG. 12D, a second wettability variable layer 85 is formed on the first wettability variable layer 82 on which the gate electrode 83 and the metal layer 84 are formed. Specifically, an NMP mixed solution including a polyimide solution PI100 (Maruzen Petrochemical Co., Ltd.) and soluble polyimide with a side-chain having a different structure from that of the material used for forming the first wettability variable layer 82, is applied by a spin coating method. This is baked at 180° C. to form the second wettability variable layer 85 having a thickness of 500 nm. The soluble polyimide used for forming the second wettability variable layer 85 does not have a side-chain for controlling the wettability; the soluble polyimide is a polyimide material that is imidized by copolymerizing a polyamic acid having only a main chain and a polyamic acid with a side chain having low surface energy before receiving energy, whereby the side chain is configured to control the main chain and wettability. Furthermore, the polyimide solution PI100 has good insulating properties, and thus has a function of a gate insulating film in the semiconductor device that is formed as described below. Furthermore, in the present embodiment, part of the surface of the metal layer 84 is masked while forming the second wettability variable layer 85. Accordingly, the second wettability variable layer 85 is formed such that part of the surface of the metal layer 84 is exposed.

Figure 13A:
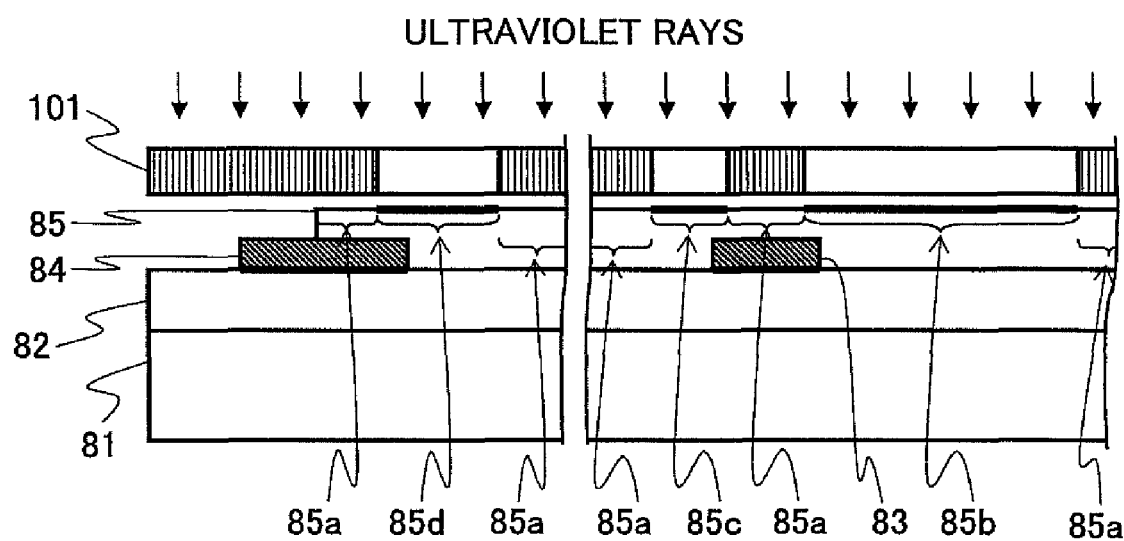
FIGS. 13A through 13C illustrate the manufacturing method (part 2) of the laminated structure according to the fifth embodiment of the present invention.

Next, as shown in FIG. 13A, ultraviolet rays are radiated from an exposing device. Specifically, an exposing device (not shown) including an extra-high pressure mercury lamp having a wavelength of less than or equal to 300 nm as the light source, performs the exposure via a photomask 101. The radiation amount of ultraviolet rays is approximately 5 J/cm$^2$. An exposure pattern is formed on the photomask 101, and ultraviolet rays are radiated onto the second wettability variable layer 85 in accordance with this exposure pattern. Accordingly, low surface energy regions 85a which have not been irradiated with the ultraviolet rays, and high surface energy regions 85b, 85c, and 85d which have been irradiated with the ultraviolet rays, are formed on the second wettability variable layer 85. A source electrode and a drain electrode are formed in the high surface energy regions 85b and 85c, respectively, and an adhesive guard ring region described below is formed in the high surface energy region 85d.

Figure 13B:
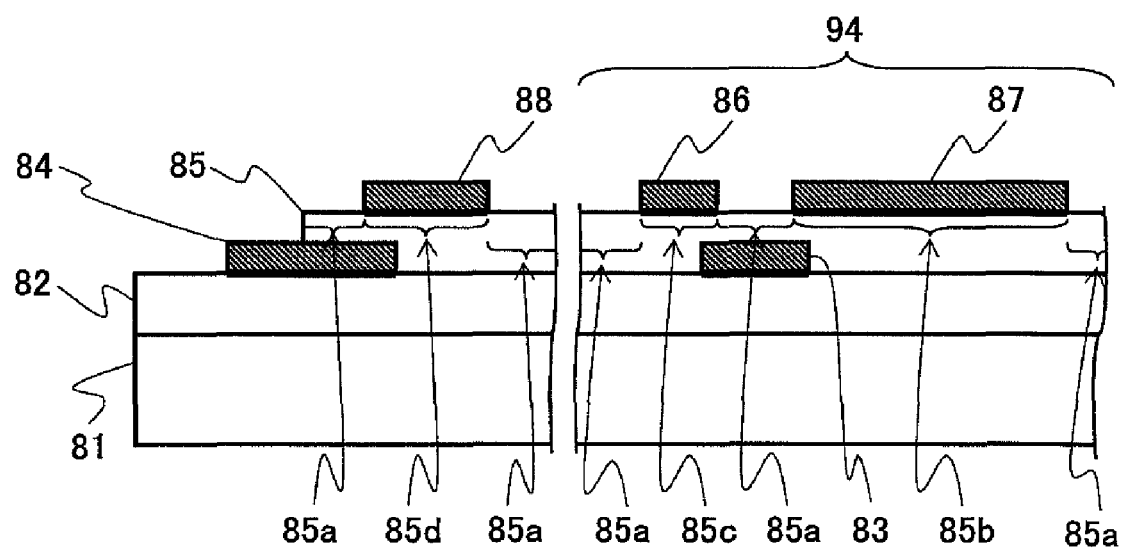

Next, as shown in FIG. 13B, by applying a fine metal particle-dispersed liquid on the second wettability variable layer 85, a source electrode 86, a drain electrode 87, and a metal layer 88 are formed. Specifically, the fine metal particle-dispersed liquid obtained by diffusing Ag fine particles in a soluble solvent, is applied on the second wettability variable layer 85 by an inkjet method. The Ag fine particles in the applied fine metal particle-dispersed liquid concentrate in the high surface energy regions 85b, 85c, and 85d of the second wettability variable layer 85. Subsequently, a firing procedure is performed at 180° C. to form the source electrode 86, the drain electrode 87, and the metal layer 88. In a circuit formation region 94, the source electrode 86 has a width of 50 μm, and the drain electrode 87 is formed so that the channel space is 5 μm.

Figure 13C:
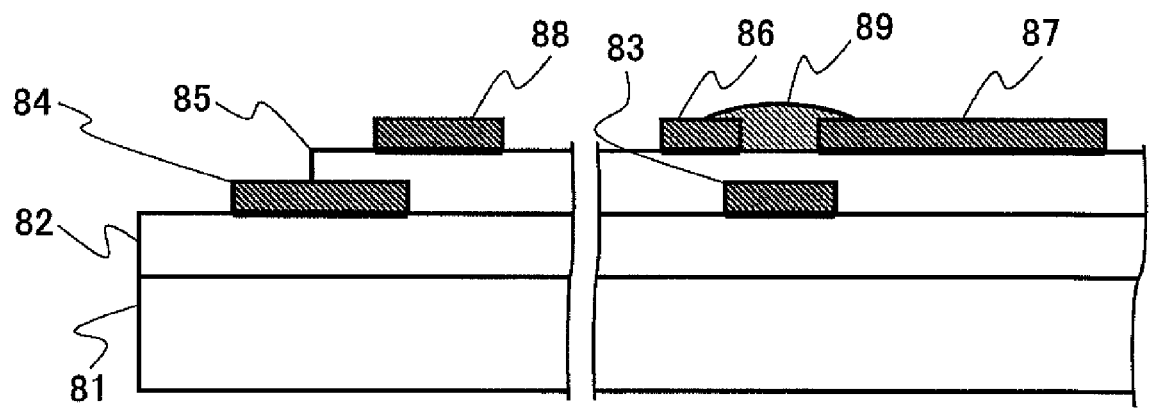

Next, as shown in FIG. 13C, an organic semiconductor layer 89 is formed. Specifically, an embrocation is made by dissolving triarylamine, which is an organic semiconductor having the structural formula of chemical formula 1, in a mixed solvent of xylene and mesitylene. This embrocation is jetted onto a region corresponding to the channel between the source electrode 86 and the drain electrode 87 by an inkjet method. Then, the embrocation is dried at a temperature of 120° C. to form the organic semiconductor layer 89 having a thickness of 30 nm.

Figure 14A:
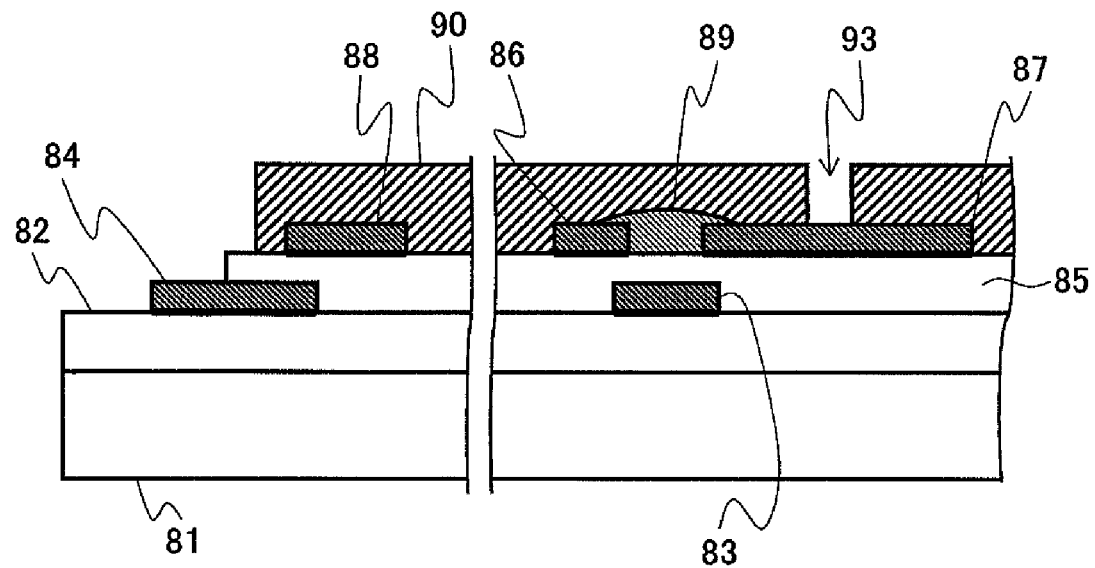
FIGS. 14A and 14B illustrate the manufacturing method (part 3) of the laminated structure according to the fifth embodiment of the present invention.

Next, as shown in FIG. 14A, an insulating film 90 is formed on the surface on which the organic semiconductor layer 89 has been formed. Specifically, an insulating material is used, which is prepared by mixing together a polyvinyl acetal resin and silica particles at a polymerization ratio of 1:2, and then turning the mixture into a paste. Then, printing is performed by a screen printing method. A pattern is formed on the screen plate in such a manner that a contact hole 93 is formed on the drain electrode 87. Subsequently, the insulating material is dried for an hour at a temperature of 100° C., to form the insulating film 90 having a film thickness of 5 μm.

Figure 14B:
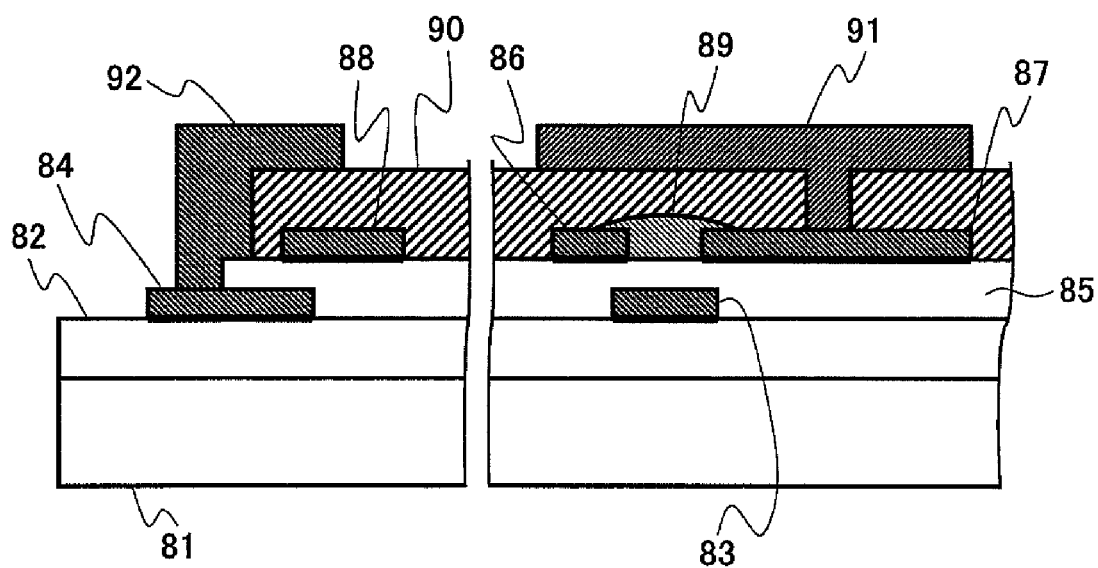

Next, as shown in FIG. 14B, a screen printing method is performed to form a pixel electrode 91 and a metal layer 92. Specifically, a conductive paste is used, which is prepared by mixing a conductive component such as Al, Ag, Cu, Ni, and carbon, with a solvent and a binder, and adding a plasticizer, a filler, and a viscosity adjustor according to need. The conductive paste is applied by a screen printing method to form the pixel electrode 91 and the metal layer 92. When forming the pixel electrode 91, the conductive paste is filled into the contact hole 93 formed in the insulating film 90. Accordingly, the pixel electrode 91 is formed, which contacts the drain electrode 87. The metal layer 92 is formed in a region partially located on the metal layer 84. The metal layer 84 and the metal layer 92 have sufficient adhesiveness, and therefore the metal layer 92 is prevented from being detached from the insulating film 90, and moisture is prevented from entering.

In the present embodiment, the first wettability variable layer 82, the second wettability variable layer 85, the gate electrode 83, the source electrode 86, the drain electrode 87, the metal layers 84, 88, and 92, the insulating film 90, and the pixel electrode 91 can be formed by a printing method, and therefore the semiconductor device can be fabricated at low cost. Furthermore, in the present embodiment, the edge faces of the second wettability variable layer 85 and the insulating film 90 are covered by the metal layer 92, thereby further reinforcing the function of preventing moisture from entering and films from being detached.

[Sixth Embodiment]

Next, a description is given of a sixth embodiment. An image display device according to the present invention uses a semiconductor device in which the organic transistors fabricated according to the fourth embodiment are arranged in an array.

Figure 15:
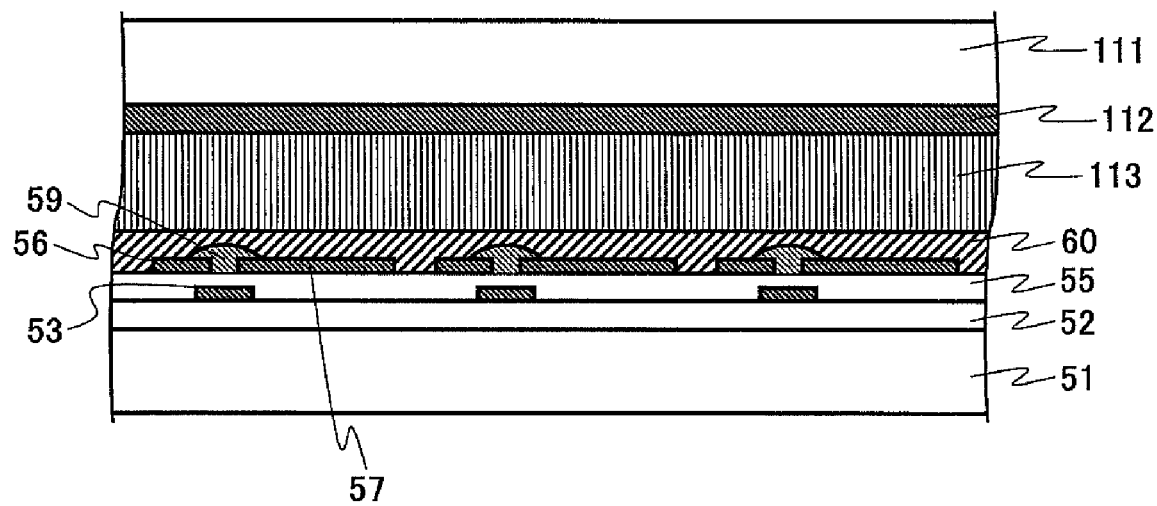
FIG. 15 is a cross-sectional view of an image display device according to a sixth embodiment of the present invention.

A configuration of the image display device according to the present embodiment is described with reference to FIG. 15.

Specifically, an image display element is formed on a semiconductor device having organic transistors fabricated according to the fourth embodiment arranged in an array. Each organic transistor includes the first wettability variable layer 52, the gate electrode 53, the second wettability variable layer 55, the source electrode 56, the drain electrode 57, the organic semiconductor layer 59, the insulating film 60, and the pixel electrode (not shown), formed on the film substrate 51.

The image display element is formed as follows. An embrocation is prepared by mixing microcapsules, which encapsulate titanium oxide particles and isopar colored with oil blue, in a polyvinyl alcohol (PVA) solution. The embrocation is applied onto a transparent electrode 112 made of ITO formed on a substrate 111 made of polycarbonate, thereby forming an image display layer 113 made of the microcapsules and a PVA binder. The image display layer 113 which has been formed as above is adhered to a semiconductor element on a semiconductor device fabricated according to the fourth embodiment, in such a manner that the substrate 51 and the substrate 111 are facing outward. A driver IC for scanning signals is connected to the bus line connected to the gate electrode 53, and a driver IC for data signals is connected to the bus line connected to the source electrode 56, to switch the screen every 0.5 seconds.

In the present embodiment, the first wettability variable layer 52, the second wettability variable layer 55, the gate electrode 53, the source electrode 56, the drain electrode 57, the metal layer 54 and 58, and the insulating film 60 can be formed by a printing method, and therefore the semiconductor device can be fabricated at low cost. Furthermore, the adhesive guard ring regions are formed, and therefore the films can be prevented from being detached from the periphery of the semiconductor device, and moisture can be prevented from entering through the edge faces of the semiconductor device.

Practical Example 1

A cross-cut stripping test was performed on samples of film configurations having the adhesive guard ring regions according to the embodiments of the present invention. A specific fabrication method of the sample is described below.

First, on a Si substrate, an NMP solution of thermosetting polyimide having a hydrophobic group in the side-chain was applied by a spin coating method. The revolving speed of the spin coater was 1500 rpm. Then, in a nitrogen atmosphere, the substrate was pre-baked at 100° C. Then, in a nitrogen atmosphere, the substrate was post-baked at 200° C. for one hour, thereby forming a wettability variable layer having a thickness of approximately 100 nm.

Next, as shown in Table 1, five samples (samples 1 through 5) were irradiated with ultraviolet rays of different radiation amounts. Next, only for the sixth sample (sample 6), a fine metal particle-dispersed liquid (nano-metal ink), in which Ag fine particles having diameters of approximately 30 nm were dispersed in a soluble solvent, was applied on the front side of the wettability variable layer. Then, a firing procedure was performed to form a metal layer. The nano-metal ink was pre-baked at 100° C., and then post-baked at 200° C. for one hour. Accordingly, a metal film of approximately 200 nm was formed on the wettability variable layer in regions irradiated by ultraviolet rays.

Next, an insulating layer was formed by a screen printing method for all of the samples. Specifically, an insulating material was used, which was prepared by mixing together barium titanate having an average particle diameter of 0.16 μm and polyvinyl butyral resin at a ratio by weight of 1:2, and then turning the mixture into a paste. Then, this paste was used to perform a screen printing method on the wettability variable layer or the metal layer. Subsequently, the paste was dried for an hour at a temperature of 100° C., to form an insulating layer of approximately 4 μm.

TABLE 1

| | GUARD RING STRUCTURE | UV RADIATION AMOUNT [J/cm$^2$] | NUMBER OF DETACHED FILMS IN CROSS-CUT STRIPPING TEST |
|---|---|---|---|
| SAMPLE 1 | POLYIMIDE | 0 | 17/25 |
| SAMPLE 2 | POLYIMIDE | 3 | 22/25 |
| SAMPLE 3 | POLYIMIDE | 5 | 25/25 |
| SAMPLE 4 | POLYIMIDE | 8 | 25/25 |
| SAMPLE 5 | POLYIMIDE | 12 | 25/25 |
| SAMPLE 6 | POLYIMIDE/ NANO Ag | 8 | 25/25 |

Table 1 shows the results of cross-cut stripping tests performed on the samples fabricated as described above. Sample 1 had a conventional configuration that did not include an adhesive guard ring region. Specifically, after forming a film made of polyimide as a wettability variable layer, an insulating film was formed without radiating ultraviolet (UV) rays. As a result of the cross-cut stripping test, the number of films that were not detached was 17 out of 25, i.e., 8 films were detached.

Sample 2 had a configuration including the adhesive guard ring region according to the second embodiment of the present invention. Specifically, after forming a film made of polyimide as a wettability variable layer, approximately 3 J/cm² of ultraviolet (UV) rays were radiated, and then the insulating film was formed. As a result of the cross-cut stripping test, the number of films that were not detached was 22 out of 25, i.e., 3 films were detached.

Sample 3 had a configuration including the adhesive guard ring region according to the second embodiment of the present invention. Specifically, after forming a film made of polyimide as a wettability variable layer, approximately 5 J/cm² of ultraviolet (UV) rays were radiated, and then the insulating film was formed. As a result of the cross-cut stripping test, the number of films that were not detached was 25 out of 25, i.e., none of the films were detached.

Sample 4 had a configuration including the adhesive guard ring region according to the second embodiment of the present invention. Specifically, after forming a film made of polyimide as a wettability variable layer, approximately 8 J/cm² of ultraviolet (UV) rays were radiated, and then the insulating film was formed. As a result of the cross-cut stripping test, the number of films that were not detached was 25 out of 25, i.e., none of the films were detached.

Sample 5 had a configuration including the adhesive guard ring region according to the second embodiment of the present invention. Specifically, after forming a film made of polyimide as a wettability variable layer, approximately 12 J/cm² of ultraviolet (UV) rays were radiated, and then the insulating film was formed. As a result of the cross-cut stripping test, the number of films that were not detached was 25 out of 25, i.e., none of the films were detached.

Sample 6 had a configuration including the adhesive guard ring region according to the first embodiment of the present invention. Specifically, after forming a film made of polyimide as a wettability variable layer, approximately 8 J/cm² of ultraviolet (UV) rays were radiated, nano-metal ink was applied to form a metal layer, and then the insulating film was formed. As a result of the cross-cut stripping test, the number of films that were not detached was 25 out of 25, i.e., none of the films were detached.

As described above, films were detached in sample 1 corresponding to the conventional configuration which was formed without radiating ultraviolet rays. However, by radiating ultraviolet rays, the problem of the detachment of films was improved. By radiating greater than or equal to approximately 5 J/cm² of ultraviolet (UV) rays on the polyimide used as a wettability variable layer, none of the films were detached. The same effects of the present invention were confirmed in the sample according to the first embodiment (sample 6) as well as the samples according to the second embodiment (sample 2, sample 3, sample 4, and sample 5).

Practical Example 2

Next, a description is given of tests performed on the laminated structure according to the embodiments of the present invention and a laminated structure according to the conventional technology.

Practical Example A

Practical example A is the laminated structure according to the first embodiment of the present invention. The fabrication method of the laminated structure according to the present practical example is described with reference to FIGS. 3A through 3D.

First, as shown in FIG. 3A, the wettability variable layer 12 was formed on the substrate 11. After performing wet washing on the substrate 11 which is a glass substrate, an NMP solution including thermosetting polyimide having a hydrophobic group in the side-chain was applied by a spin coating method at a revolving speed of 1500 rpm. Then, in a nitrogen atmosphere, the substrate was pre-baked at 100° C. Then, once again in a nitrogen atmosphere, the substrate was post-baked at 200° C. for one hour, thereby forming the wettability variable layer 12 having a film thickness of approximately 100 nm on the glass substrate 11. At this point, the surface of the wettability variable layer 12 was in a low surface energy state due to the polyimide having a hydrophobic group in the side-chain.

Next, as shown in FIG. 3B, ultraviolet rays were radiated from an exposing device onto the wettability variable layer 12, with the use of the mask (photomask) 20. The photomask 20 had a wiring pattern for the circuit formation region and a pattern for the adhesive guard ring region around the circuit formation region. The exposing device included an extra-high pressure mercury lamp having a wavelength of less than or equal to 300 nm as the light source. By radiating the ultraviolet rays via the photomask 20, the high surface energy regions 12b and 12c which have been irradiated with the ultraviolet rays, and the low surface energy regions 12a which have not been irradiated with the ultraviolet rays, were formed on the surface of the wettability variable layer 12. The radiation amount of the ultraviolet rays was approximately 8 J/cm². In the present practical example, the exposing method performed by the exposing device was contact exposure or proximity exposure, which is performed in close contact with the object of exposure. However, in order to form finer patterns, reduced projection exposure may be performed with the use of reticle. On the photomask 20 used in the present practical example, the wiring patterns for the circuit formation region each had a width of 80 μm and were spaced apart by 40 μm. Furthermore, on the photomask 20, the pattern for the adhesive guard ring region around the circuit formation region was formed approximately 100 μm away from the region on the photomask 20 corresponding to the circuit formation region, and had a width of approximately 200 μm.

Next, as shown in FIG. 3C, a fine metal particle-dispersed liquid (nano-metal ink), in which Ag fine particles each having a diameter of 30 nm have been dispersed in a soluble solvent, was jetted by an inkjet method from an inkjet head, so as to be selectively applied to the regions in which the conductive layers 13 are to be formed in the circuit formation region and the adhesive guard ring region in which the metal layer 14 is to be formed. With the inkjet method, the nano-metal ink can be provided in a selective manner, thus increasing the material use efficiency, reducing cost (in a case of using Ag which is a relatively expensive material), and reducing the number of procedures. The nano-metal ink is dispersed in a soluble solvent, and thus expands over the entirety of each of the high surface energy regions 12b and 12c. Therefore, fine patterns can be formed without being affected by the size of each droplet jetted from the inkjet head. Subsequently, the substrate was pre-baked at 100° C. in the atmosphere, and was post-baked at 200° C. in the atmosphere. Accordingly, in the circuit formation region, the conductive layers 13 and the metal layer 14 were simultaneously formed. Specifically, the conductive layers 13 each had a film thickness of 150 nm, in which the wiring patterns each had a width of 80 μm and were spaced apart by 40 μm. The metal layer 14 having a film thickness of 150 nm formed an adhesive guard ring region having a width of 200 μm around the circuit formation region.

Next, as shown in FIG. 3D, the insulating layer 15 was formed. Specifically, printing was performed by a screen printing method, with the use of an insulating paste and a screen plate configured to form an opening at a power source supplying unit (not shown). The insulating material constituting the insulating paste was prepared by mixing together barium titanate having an average particle diameter of 0.16 μm with a solution obtained by dissolving polyvinyl butyral resin in a solvent at a ratio by weight of 1:2, with the use of a roller mill. After the screen printing was performed, the paste was dried for an hour at a temperature of 100° C., to form the insulating layer 15 of approximately 4 μm.

In the laminated structure formed in the above manner, the adhesiveness between the insulating layer 15 and the wettability variable layer 12 was high, and therefore the insulating layer 15 was not detached as a result of performing a tape test.

Practical Example B

Practical example B is the laminated structure according to the second embodiment of the present invention. The fabrication method of the laminated structure according to the present practical example is described with reference to FIGS. 5A through 5D.

First, as shown in FIG. 5A, the wettability variable layer 22 was formed on the substrate 21. After performing wet washing on the substrate 21 which is a glass substrate, an NMP solution including thermosetting polyimide having a hydrophobic group in the side-chain was applied by a spin coating method at a revolving speed of 1500 rpm. Then, in a nitrogen atmosphere, the substrate was pre-baked at 100° C. Then, once again in a nitrogen atmosphere, the substrate was post-based at 200° C. for one hour, thereby forming the wettability variable layer 22 having a film thickness of approximately 100 nm on the glass substrate 21. At this point, the surface of the wettability variable layer 22 was in a low surface energy state due to the polyimide having a hydrophobic group in the side-chain.

Next, as shown in FIG. 5B, ultraviolet rays were radiated from an exposing device onto the wettability variable layer 22, with the use of the mask (photomask) 30. The photomask 30 had a wiring pattern for the circuit formation region and a pattern for the adhesive guard ring region around the circuit formation region. The exposing device included an extra-high pressure mercury lamp having a wavelength of less than or equal to 300 nm as the light source. By radiating the ultraviolet rays via the photomask 30, the high surface energy regions 22b and 22c which have been irradiated with the ultraviolet rays, and the low surface energy regions 22a which have not been irradiated with the ultraviolet rays, were formed on the surface of the wettability variable layer 22. The radiation amount of the ultraviolet rays was approximately 8 J/cm$^2$. On the photomask 30 used in the present practical example, the wiring patterns for the circuit formation region each had a width of 80 μm and were spaced apart by 40 μm. Furthermore, on the photomask 30, the pattern for the adhesive guard ring region around the circuit formation region was formed approximately 100 μm away from the region on the photomask 30 corresponding to the circuit formation region, and had a width of approximately 300 μm.

Figure 16:
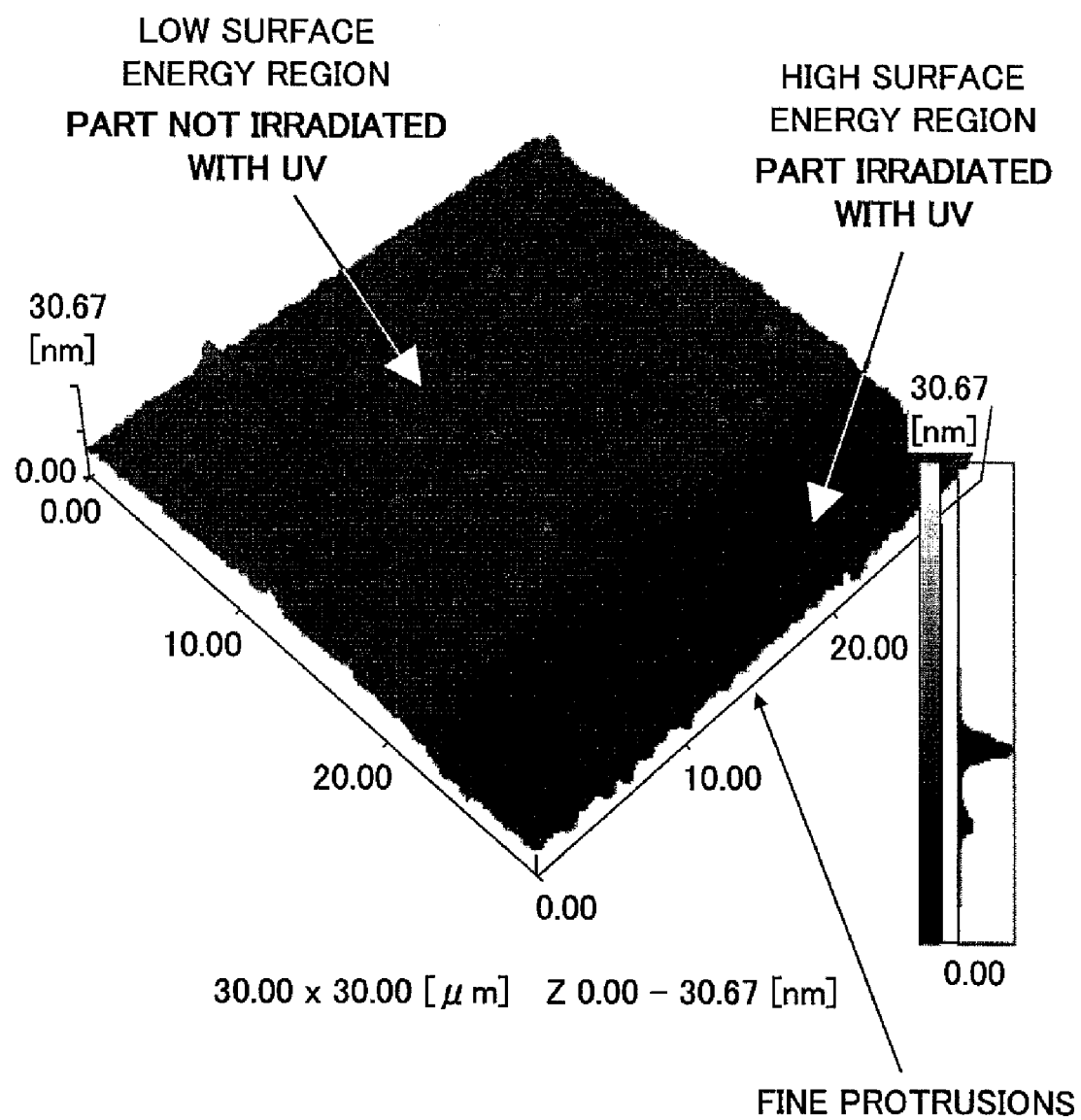
FIG. 16 illustrates surface observation results of a wettability variable layer.

The thermosetting polyimide used in the present practical example was a mixture of a polyamic acid having only a main chain and without a side chain for controlling wettability, and a polyamic acid with a side chain having low surface energy before receiving energy which is configured to control the main chain and wettability. FIG. 16 illustrates SPM surface observation results of a region irradiated with ultraviolet rays and a region not irradiated with ultraviolet rays, which were observed with the use of a nano search microscope LEXT OLS3500 (manufactured by Olympus Corporation).

It can be confirmed from FIG. 16 that the high surface energy region irradiated with ultraviolet rays has multiple protrusions each having a diameter of approximately 1.2 μm and a depth of several nm through several tens of nm. The density and depths of these protrusions can be varied according to the radiation amount of the ultraviolet rays. In the present practical example, the arithmetic average roughness Ra was 6.4 nm in the high surface energy region irradiated with ultraviolet rays. By forming such protrusions, it is considered that the adhesiveness between the wettability variable layer and a film formed on the wettability variable layer can be increased, and the wettability can be increased.

Next, as shown in FIG. 5C, a fine metal particle-dispersed liquid (nano-metal ink), in which Ag fine particles each having a diameter of 30 nm have been dispersed in a soluble solvent, was jetted by an inkjet method from an inkjet head, so as to be selectively applied to the regions in which the conductive layers 23 are to be formed in the circuit formation region. With the inkjet method, the nano-metal ink can be provided in a selective manner, thus increasing the material use efficiency, reducing cost (in a case of using Ag which is a relatively expensive material), and reducing the number of procedures. The nano-metal ink is dispersed in a soluble solvent, and therefore expands over the entirety of each of the high surface energy regions 12b. Thus, fine patterns can be formed without being affected by the size of each droplet jetted from the inkjet head. Subsequently, the substrate was pre-baked at 100° C. in the atmosphere, and was post-baked at 200° C. in the atmosphere. Accordingly, in the circuit formation region, the conductive layers 23 were formed. Specifically, the conductive layers 23 each had a film thickness of 150 nm, in which the wiring patterns each had a width of 80 μm and were spaced apart by 40 μm.

Next, as shown in FIG. 5D, the insulating layer 25 was formed. Specifically, printing was performed by a screen printing method, with the use of an insulating paste and a screen plate configured to form an opening at a power source supplying unit (not shown). The insulating material constituting the insulating paste was prepared by mixing together barium titanate having an average particle diameter of 0.16 μm with a solution obtained by dissolving polyvinyl butyral resin in a solvent at a ratio by weight of 1:2, with the use of a roller mill. After the screen printing was performed, the paste was dried for an hour at a temperature of 100° C., to form the insulating layer 25 of approximately 5 μm. By forming the insulating layer 25, an adhesive guard ring region having a width of 300 μm was formed in the high surface energy region 22c in such a manner as to surround the circuit formation region.

In the laminated structure formed in the above manner, the adhesiveness between the insulating layer 25 and the wettability variable layer 22 was high, and therefore the insulating layer 25 was not detached as a result of performing a tape test.

Comparative Example A

A laminated structure was fabricated, which had the same configuration as that of practical example A except that an adhesive guard ring region was not formed. Specifically, the photomask used in this example had patterns arranged so as not to form an adhesive guard ring region, but was otherwise the same as the photomask 20 used in FIG. 3B. Accordingly, neither the high surface energy region 12c nor the metal layer 14 was formed. Furthermore, the thickness of the insulating layer was 4 μm, but other conditions were the same as those of practical example A. In the laminated structure formed in the above manner, the insulating layer was detached as a result of performing a tape test.

The present invention is not limited to the specifically disclosed embodiment, and variations and modifications may be made without departing from the scope of the present invention.

The present application is based on Japanese Priority Patent Application No. 2008-121564, filed on May 7, 2008, the entire contents of which are hereby incorporated herein by reference.

What is claimed is:

1. A laminated structure comprising:
a substrate;
a wettability variable layer formed on the substrate, comprising a material whose critical surface tension varies by receiving energy so as to change from a low surface energy state to a high surface energy state, wherein high surface energy regions, generated by receiving the energy, and low surface energy regions are formed on the wettability variable layer;
a conductive layer formed in one of the high surface energy regions on the wettability variable layer; and
an insulating layer formed in such a manner as to cover the conductive layer, wherein,
another one of the high surface energy regions is formed on the wettability variable layer in such a manner as to surround a periphery of a circuit formation region in which a plurality of the conductive layers are formed,
the insulating layer is formed in such a manner as to also cover the other one of the high surface energy regions so that an adhesive guard ring region is formed between the wettability variable layer and the insulating layer,
an additional one of the high surface energy regions is formed on the wettability variable layer inside a part surrounded by the adhesive guard ring region and where the conductive layer is not formed, and
the insulating layer is formed in such a manner as to also cover the additional one of the high surface energy regions so that an adhesive reinforcing region is formed between the wettability variable layer and the insulating layer.

2. A laminated structure comprising:
a substrate;
a wettability variable layer formed on the substrate, comprising a material whose critical surface tension varies by receiving energy so as to change from a low surface energy state to a high surface energy state, wherein high surface energy regions, generated by receiving the energy, and low surface energy regions are formed on the wettability variable layer;
a conductive layer formed in one of the high surface energy regions on the wettability variable layer; and
an insulating layer formed in such a manner as to cover the conductive layer, wherein,
another one of the high surface energy regions is formed on the wettability variable layer in such a manner as to surround a periphery of a circuit formation region in which a plurality of the conductive layers are formed; and
a metal layer made of the same material as that of the conductive layer is formed in the other one of the high surface energy regions so that an adhesive guard ring region is formed between the wettability variable layer and the metal layer.

3. The laminated structure according to claim 2, wherein the metal layer has a function of a dummy pattern provided at the periphery of the circuit formation region.

4. The laminated structure according to claim 2, wherein:
an additional one of the high surface energy regions is formed on the wettability variable layer inside a part surrounded by the adhesive guard ring region and where the conductive layer is not formed; and
the metal layer is formed in such a manner as to also cover the additional one of the high surface energy regions so that an adhesive reinforcing region is formed between the wettability variable layer and the metal layer.

5. An image display device comprising:
a semiconductor device; and
an image display element configured to display an image, wherein the semiconductor device comprises:
a laminated structure;
a semiconductor layer; and
an insulating film, wherein the laminated structure comprises:
a substrate;
a wettability variable layer formed on the substrate, comprising a material whose critical surface tension varies by receiving energy so as to change from a low surface energy state to a high surface energy state, wherein high surface energy regions, generated by receiving the energy, and low surface energy regions are formed on the wettability variable layer;
a conductive layer formed in one of the high surface energy regions on the wettability variable layer; and
an insulating layer formed in such a manner as to cover the conductive layer, wherein,
another one of the high surface energy regions is formed on the wettability variable layer in such a manner as to surround a periphery of a circuit formation region in which a plurality of the conductive layers are formed,
the insulating layer is formed in such a manner as to also cover the other one of the high surface energy regions so that an adhesive guard ring region is formed between the wettability variable layer and the insulating layer,
an additional one of the high surface energy regions is formed on the wettability variable layer inside a part surrounded by the adhesive guard ring region and where the conductive layer is not formed, and
the insulating layer is formed in such a manner as to also cover the additional one of the high surface energy regions so that an adhesive reinforcing region is formed between the wettability variable layer and the insulating layer.

* * * * *